United States Patent
Yamada et al.

(10) Patent No.: US 6,515,734 B1
(45) Date of Patent: Feb. 4, 2003

(54) EXPOSURE APPARATUS

(75) Inventors: Hidetoshi Yamada, Tokyo (JP);
Susumu Kikuchi, Hachioji (JP);
Toshihiro Kitahara, Tachikawa (JP);
Hiroya Fukuyama, Sagamihara (JP);
Tatsuo Nagasaki, Yokohama (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/730,351

(22) Filed: Dec. 5, 2000

(30) Foreign Application Priority Data

Dec. 6, 1999 (JP) ............................................ 11-346753
Dec. 14, 1999 (JP) ............................................ 11-354762

(51) Int. Cl.⁷ ........................ G03B 27/44; G03B 27/72; A61N 5/00; G01B 11/00; F23D 3/04

(52) U.S. Cl. ........................ 355/54; 355/35; 355/67; 355/77; 355/40; 355/71; 250/492.2; 250/492.22; 356/399; 356/400; 430/311; 430/312; 430/359

(58) Field of Search ........................ 355/35, 54, 67, 355/77, 40, 71; 250/492.2, 492.22; 356/399, 400; 430/311, 312, 359

(56) References Cited

U.S. PATENT DOCUMENTS

| | | | |
|---|---|---|---|
| 2,622,071 A | 12/1952 | Harrison | 260/19 |
| 4,483,871 A | 11/1984 | Tahara et al. | 424/312 |
| 4,642,314 A | 2/1987 | Tahara et al. | 514/475 |
| 4,738,801 A | 4/1988 | Tahara et al. | 260/410.9 R |
| 5,198,574 A | 3/1993 | Ritter et al. | 560/224 |
| 5,602,620 A * | 2/1997 | Miyazaki et al. | 355/53 |
| 5,617,211 A * | 4/1997 | Nara et al. | 356/401 |

(List continued on next page.)

FOREIGN PATENT DOCUMENTS

| | | |
|---|---|---|
| DE | 40 19 778 | 1/1992 |
| GB | 1011390 | 11/1965 |

(List continued on next page.)

OTHER PUBLICATIONS

Hauben–Weyl, Methoden der organischen Chemie, vol. 8 (month unavailable), 1952, pp. 516–526, "II. Carbonsäureester aus Carbonsäuren und ihren Derivaten".

(List continued on next page.)

*Primary Examiner*—Russell Adams
*Assistant Examiner*—Khaled Brown
(74) *Attorney, Agent, or Firm*—Frishauf, Holtz, Goodman & Chick, P.C.

(57) ABSTRACT

An exposure apparatus is arranged to project one unit of a circuit pattern onto the surface of a resist on a substrate to be manufactured and to expose it over the surface of this resist. The exposure apparatus includes a processing unit that enables forming a high-resolution circuit pattern image on the substrate by the use of an image display which is able to ensure a wide display region without deteriorating the resolution, and that when dividing the one unit of circuit pattern into a plurality of regions in order to ensure an inexpensive, reliable exposure operation, divides it so that adjacent ones of the divided regions may partly overlap each other. An exposure device includes a plurality of optical systems each of that projects one of a plurality of the divided regions onto the surface of the resist on the substrate. A control unit causes a plurality of the divided regions to be simultaneously projected on the surface of the resist in such a way as to cause duplex regions between the adjacent regions to overlap each other on the surface of the resist on the substrate to thereby cause the one unit of circuit pattern image to be formed on the surface of the resist on the substrate.

38 Claims, 22 Drawing Sheets

U.S. PATENT DOCUMENTS

| | | | | |
|---|---|---|---|---|
| 5,715,037 A | * | 2/1998 | Saiki et al. | 355/53 |
| 5,742,362 A | * | 4/1998 | Chikamichi | 349/2 |
| 5,929,973 A | * | 7/1999 | Kakizaki et al. | 355/26 |
| 5,999,244 A | * | 12/1999 | Yanagihara et al. | 355/53 |

FOREIGN PATENT DOCUMENTS

| | | |
|---|---|---|
| JP | 56070097 | 6/1981 |
| JP | 07-035994 | 2/1995 |
| JP | 9-17719 | 1/1997 |
| JP | 9-326981 | 12/1997 |
| JP | 11-45851 | 2/1999 |
| JP | 11029524 | 2/1999 |
| WO | 92/00947 | 1/1992 |

OTHER PUBLICATIONS

Ullmann's Encl. of Ind. Chemistry, vol. A9, (date unavailable), pp. 565–585, W. Riemenschneider, "Esters, Organic".

Hauben–Weyl, Methoden der organischin Chemie, vol. E5/Part 1, (month unavailable), 1985, pp. 660–684, H. Pielartzik, et al, "3. aus Carbonsäuren bzw. CarbonsäureDerivaten".

Tetrahedron Letters, Bd. 46, 1978, Seiten 4461–4464, XP002166834, Oxford GB, Seite 4463; Tabelle 1, Hsing-Jang Liu et al, "Convenient Procedures for Esterification of Carboxylic Acids".

Journal of the American Chemical Society, Bd. 79, Nr. 17, Sep. 11, 1957, Seiten 4759–4761, XP002166835, DC US, Seite 4761, Spalte 2, Friedrich Hoffmann et al, "Esterification of Carboxylic Acids by Dialkyl Phosphonates".

* cited by examiner

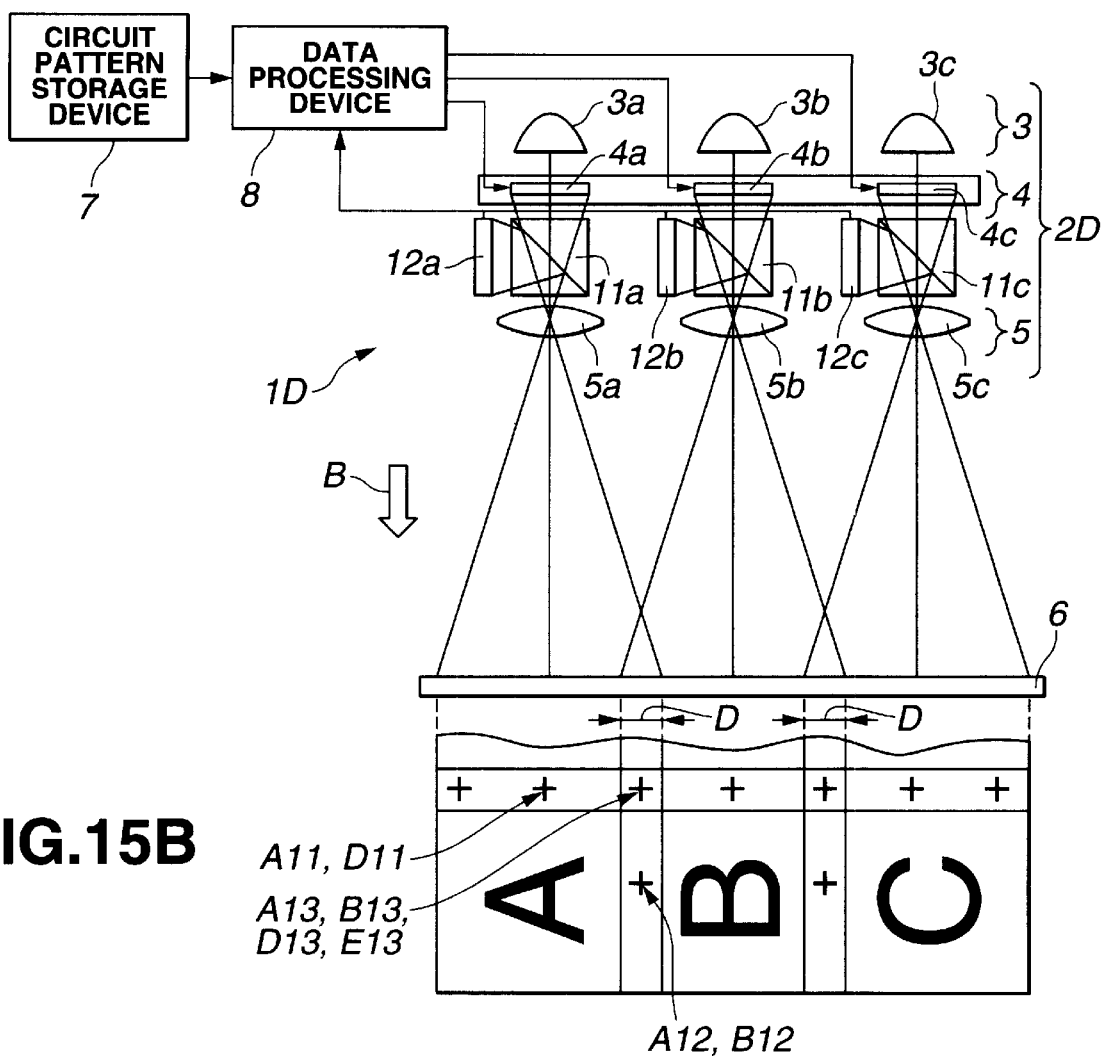
FIG.15A
FIG.15B
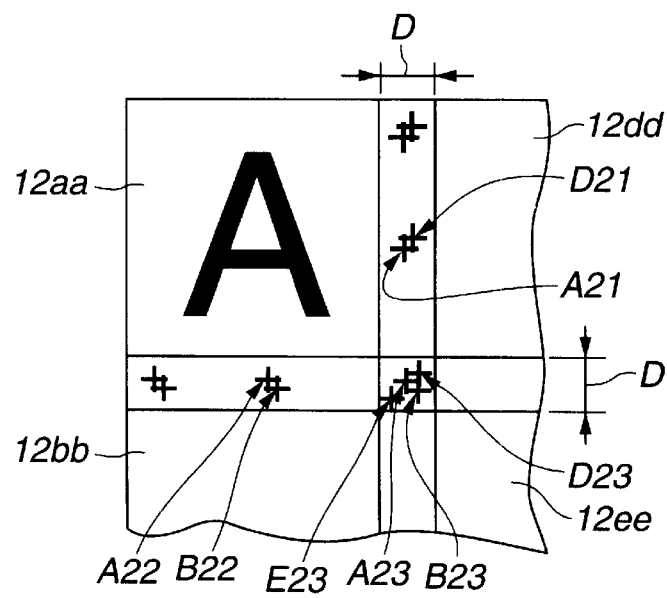
FIG.16

EXPOSURE APPARATUS

This application claims the benefit of Japanese Applications No. H11-346753 filed Dec. 6, 1999 and No. H11-354762 filed Dec. 14. 1999, the contents of which are incorporated by this reference.

BACKGROUND OF THE INVENTION

1. Field of the Invention

The present invention relates to an exposure apparatus and, more particularly, to an exposure apparatus for exposing a circuit pattern of a semiconductor device, liquid crystal display device, etc. to a prescribed substrate, etc. The invention also concerns an exposure apparatus for exposing a prescribed circuit pattern, etc. to a prescribed substrate, etc. in order to manufacture a high-density print circuit substrate of a BGA substrate, CSP substrate, etc.

2. Description of the Related Art

An exposure apparatus for optically exposing a circuit pattern of a semiconductor device, liquid crystal display device, etc., which is what is called "a stepper", has hitherto been generally put to practical use.

An ordinary exposure apparatus is generally constructed in such a form wherein, for example, a so-called "reticule" becoming an original substrate, which has a circuit pattern formed on a glass substrate (glass mask), is prepared; with respect to this reticule an illumination light is irradiated and this beam of light is passed through a projection optical system to thereby cause a circuit pattern image reduced or increased in size to be formed; and the resulting circuit pattern image is exposed to a substrate such as a wafer or glass substrate that has coated thereon a photo-resist. However, in this exposure apparatus, it is difficult to form the reticule becoming an original substrate by the use of a glass substrate and at a low cost.

On this account, an apparatus wherein, using a display device such as a liquid crystal device (Liquid Crystal Device: LCD), etc. in place of a glass substrate serving as the conventional reticule, the circuit pattern is caused to be displayed, and the resulting arrangement is used as the original substrate has variously been proposed in, for example, Japanese Patent Application Laid-Open Nos. 9-17719 and 11-45851.

The apparatus disclosed in the above-described Japanese Patent Application Laid-Open Nos. 9-17719 and 11-45851 is constructed into a form wherein, in place of the reticule consisting of a glass substrate, etc. having a circuit pattern formed thereon, a circuit pattern, etc. such as design data, etc. is displayed on the display part of a single liquid crystal panel, consisting of a display device or the like such as a liquid crystal display device (LCD). And a circuit pattern image obtained by reducing or increasing the size of the circuit pattern through a projection optical system is projected onto a substrate, and thereby a desired circuit pattern is optically exposed.

However, in the apparatus disclosed in any of the above-described Japanese Patent Application Laid-Open Nos. 9-17719 and 11-45851, a single liquid crystal panel is used. In order to project a clearer circuit pattern image, the liquid crystal panel is needed to have a higher resolution. But, the resolution of the liquid crystal panel depends upon the number of pixels per unit area of the display devices forming the liquid crystal panel. However, a limitation is imposed upon the increase in the number of pixels.

Namely, in the case of using a single liquid crystal panel, in case the widening of the display area attempts to be ensured without deteriorating the resolution of the liquid crystal panel, the manufacturing cost of the liquid crystal panel tends to increase very much. Also, when making small the display area of each of the individual display devices, there is a limitation.

Accordingly, for example, in the case of projecting a finely designed circuit pattern such as an IC or LSI onto the substrate, in the apparatus using the display means comprised of a single liquid crystal panel, etc., ensuring a sufficient value of resolving power leads to an increase in the cost compared to the conventional case where using a glass substrate, etc. as the reticule. Therefore, there is the problem that realizing such resolving power easily and at a low cost is difficult.

On the other hand, an exposure apparatus wherein in order to manufacture a high-density substrate, etc. such as a BGA substrate or CSP substrate a prescribed circuit pattern, etc. is exposed to a prescribed substrate material has hitherto been generally put to practical use.

When manufacturing the high-density printed substrate, the following steps are generally performed. For example, using data based on the use of a circuit pattern, an exposure printing mask is produced. This mask is set in the exposure apparatus, whereby prescribed exposure is performed with respect to a prescribed substrate material. Thereafter, prescribed steps of processing such as developing of the already exposed substrate material, etching thereof, etc. are performed.

However, in recent years, when manufacturing a high-density printed substrate, etc., it has been demanded to enable manufacturing various different kinds of printed substrates such as a BGA substrate or CSP substrate with the use of the same manufacturing apparatus. It is inefficient when each time the kind of the printed substrates is different a new mask is produced.

Under the above-described existing circumstances, various proposals for manufacturing a desired high-density printed substrate, etc. without using the exposure printing mask, have in recent years been made in, for example, Japanese Patent Application Laid-Open No. 7-35994.

The apparatus disclosed in Japanese Patent Application Laid-Open No. 7-35994 uses, in place of the step of producing an exposure printing mask and an exposure step of exposing a desired circuit pattern, according to this exposure printing mask, means for directly depicting a desired circuit pattern with respect to a substrate to be manufactured by the use of a laser beam according to prescribed data representing a desired circuit pattern. And, in the apparatus of the above Publication, disclosed is the following. In order to realize an increase in the speed of manufacture, a plurality of laser beams are provided. Correspondingly to these laser beams, the entire desired circuit pattern to be depicted is divided into a plurality of regions. And, the respective divided regions are depicted in parallel using a plurality of the laser beams.

The problem with the apparatus disclosed in Japanese Patent Application Laid-Open No. 7-35994 was that the construction became very complex.

OBJECTS AND SUMMARY OF THE INVENTION

A first object of the present invention is to provide an exposure apparatus that utilizes an image display, in which there is ensured a wider region of display area using a plurality of liquid crystal panels each having a general display size, etc. without deteriorating the resolution, and thereby enables forming a sufficiently high resolution of image of even a finely designed circuit pattern onto a substrate.

A second object of the invention is to provide an exposure apparatus that enables ensuring an inexpensive and reliable exposure operation to be performed.

A third object of the invention is to provide an exposure apparatus that is constructed without using an exposure printing mask and that can easily cope with various kinds of sizes of substrates, various circuit patterns, etc., thereby enabling realizing higher availability.

A fourth object of the invention is to provide an exposure apparatus that is simpler in construction and can realize an increase in speed.

Briefly explaining, the first invention, an exposure apparatus is adapted to project one unit of circuit pattern onto the surface of a resist on a substrate, which exposure apparatus comprises a division processing section that, in case one unit of circuit pattern is divided into a plurality of regions, divides it so that adjacent ones of the regions may partly overlap each other, an exposure section that is equipped with a plurality of optical systems each projecting one divided region of a plurality of the divided regions onto the resist surface on the substrate, and a controller means that, while causing duplex regions of the adjacent regions to overlap each other on the resist surface on the substrate, causes a plurality of the divided regions to be simultaneously projected onto the resist surface by the exposure section to thereby cause an image of one unit of circuit pattern to be formed on the resist surface of the substrate.

According to a second aspect the, invention provides an exposure apparatus that comprises a light source that radiates an illumination light for performing exposure, a modulator which modulates the spatial intensity distribution of the illumination light from the light source according to code data produced from a design circuit pattern, a plurality of exposure units each of which is constructed in such a way as to include an optical system for projecting the illumination light the spatial intensity distribution of which has been modulated, means for properly disposing each of the individual exposure units according to the code data that is obtained correspondingly to the disposition of the substrate, and a correction processor which performs correction processing with respect to the code data representing the design circuit pattern so that a pattern image that is formed according to the code data may be projected onto the surface of exposure in a state of its being proper on this surface of exposure.

These and other objects and the advantages of the invention will become apparent from the following detailed explanation.

According to the first aspect of the invention, it is possible to provide an exposure apparatus that, utilizing the image display that ensures the procurement of a wider region of display area without deteriorating the resolution by the use of a plurality of liquid crystal panels each having a general display size, enables even a finely designed circuit pattern to have formed on the substrate an image that has a sufficiently large value of resolution, and that enables ensuring the performance of an inexpensive, reliable exposure operation.

Also, according to the second aspect of the invention, it is possible to provide an exposure apparatus which does not use an exposure printing mask, and that can easily cope with various kinds of substrate size, circuit pattern, etc. to thereby realize a high level of general applicability and that can realize a simpler construction and the increase in an operational speed of the apparatus.

BRIEF DESCRIPTION OF THE DRAWINGS

FIG. 15A is a schematic construction view illustrating the exposure apparatus of FIG. 14;

FIG. 15B is a view illustrating part of the projection image when having looked at the substrate from the arrow B direction of FIG. 15A;

FIG. 16 is a view illustrating duplex regions each of that is between the image represented by image data that has been gotten by a CCD of the imaging element in the exposure apparatus of FIG. 14 and the image data represented by image data that has been gotten by adjacent ones of the CCDs thereof;

DETAILED DESCRIPTION OF THE PREFERRED EMBODIMENTS

Figure 1:
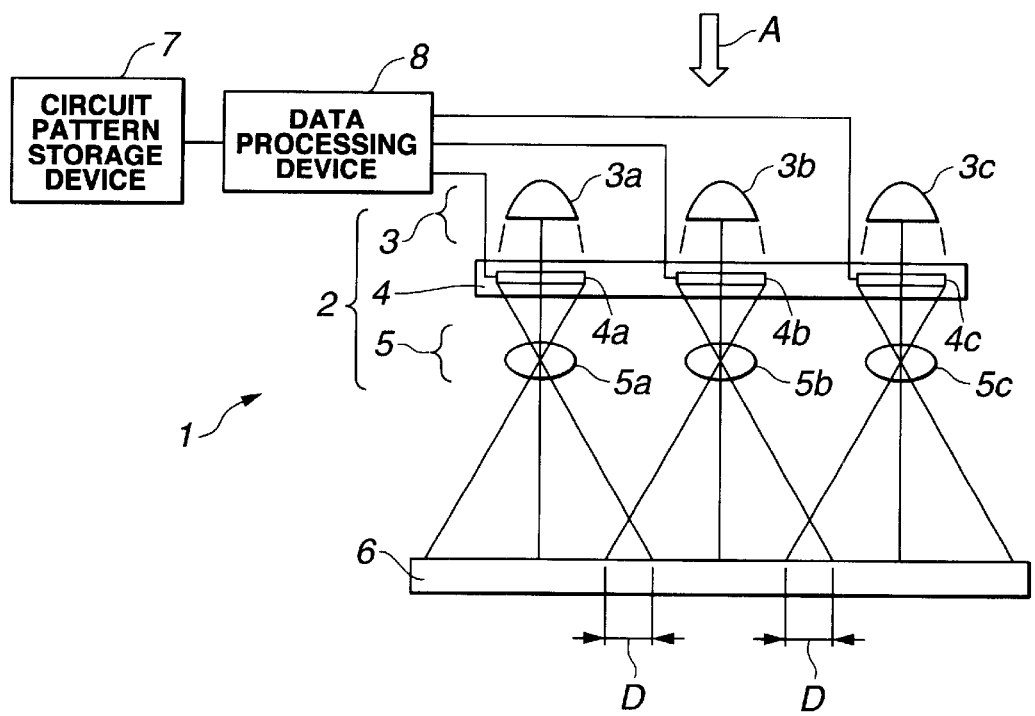
FIG. 1 is a schematic construction view illustrating an exposure apparatus according to a first embodiment of the invention.
Figure 2:
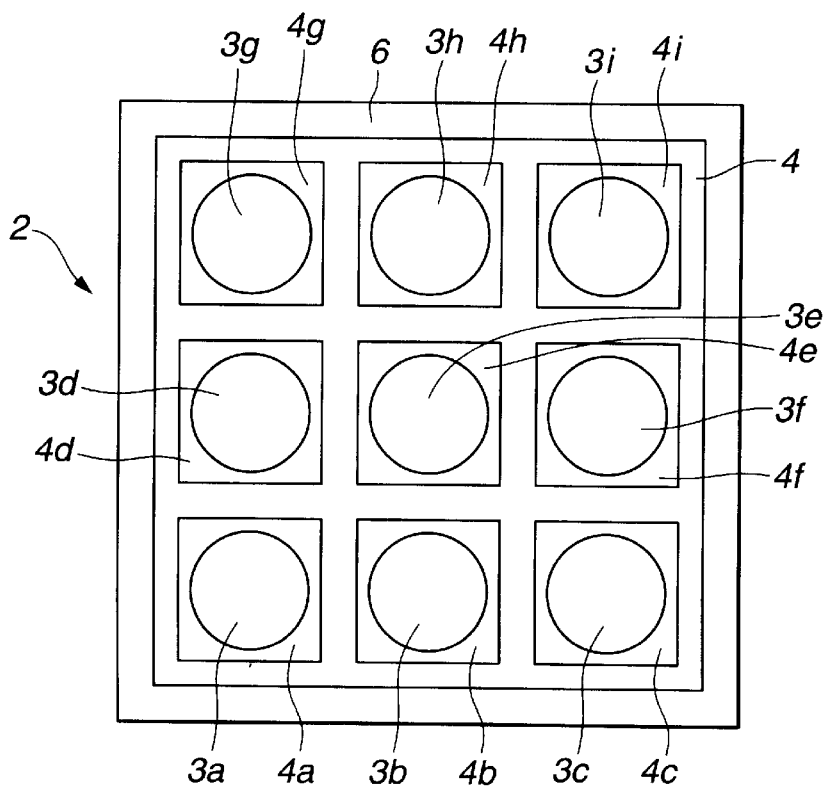
FIG. 2 is a view that is taken when having looked at the exposure apparatus of FIG. 1 from the direction indicated by the arrow A, and that illustrates the array of a plurality of illumination means and display means.

FIGS. 1 and 2 illustrate an exposure apparatus according to a first embodiment of the present invention. FIG. 1 is a schematic constructional view illustrating a construction of the exposure apparatus. FIG. 2 is a view that is taken when the exposure apparatus is seen from a direction indicated by the arrow A of FIG. 1, the view illustrating an arrangement of a plurality of illumination means and display means.

In the exposure apparatus of this embodiment, as the reticle serving as an original substrate, there is not used the glass substrate that is conventionally used. A display device or the like such as a liquid crystal display device, for example, a liquid crystal display device comprised of a liquid crystal display panel, etc., is instead used.

Namely, as illustrated in FIG. 1, the exposure apparatus 1 of this embodiment is comprised of a circuit pattern storage device 7 that is memory means which has stored therein circuit pattern data prepared by a circuit pattern such as design data being converted to a prescribed form of data, a data-processing device 8 that is data processing means that reads out circuit pattern data representing a single circuit pattern from the circuit pattern storage device 7 to thereby perform divisional signal processing so as for that circuit pattern data to become a plurality of region data, an image display device 4 that is control means for respectively displaying as an image a plurality of the region data having been subjected to divisional signal processing by the data-processing device 8, and that is image display means consisting of a plurality of liquid crystal display panels (display devices) and that is a liquid crystal display device (hereinafter referred to simply as "an LCD"), an illumination device 3 that is illumination means for illuminating a display region of the image display device 4, and a magnifying projection optical system 5 that magnifies that magnifies the display image obtained by the image display device 4 that has been illuminated by the illumination device 3 and projects the thus-magnified display image onto an exposure surface of a substrate 6 disposed at a prescribed position to thereby form thereon a single circuit pattern image that is represented by the circuit pattern data.

It is to be noted that, in addition to these pieces of construction, for example, with respect to the data-processing device 8, it is possible to provide reception means that receives a prescribed item of circuit pattern data from another external appliance (not illustrated). And, it is thereby possible to supply the prescribed data from other than the circuit pattern storage device 7 to the exposure apparatus 1.

The illumination device 3 is comprised of a plurality of illuminators. And, in the exposure apparatus 1 of this embodiment, nine pieces of illuminators 3a, 3b, 3c, 3d, 3e, 3f, 3g, 3h, and 3i are disposed as illustrated in FIG. 2.

The image display device 4 is comprised of a plurality of liquid crystal display panels (display devices). And, in the exposure apparatus 1 of this embodiment, nine pieces of liquid crystal display panel 4a, 4b, 4c, 4d, 4e, 4f, 4g, 4h, and 4i are disposed as illustrated in FIG. 2.

Also, the magnifying projection optical system 5 is comprised of a plurality of optical systems each having a plurality of lens constructions. And, in the exposure apparatus 1 of this embodiment, nine pieces of lens 5a, 5b, 5c, - - - , and 5i (In FIG. 1 only part thereof is illustrated. In FIG. 2 no illustration thereof is made.)

And, these nine pieces of illuminators 3a, - - - , and 3i and nine pieces of liquid crystal display panel 4a, - - - , and 4i are arranged so as to correspond to their respective prescribed positions so that these illuminators and liquid crystal display panels may be co-axial with the respective optical axes of those nine pieces of lens 5a, - - - , and 5i. In the following description, a unit that is mainly comprised of the illumination device 3, image display device 4, and magnifying projection optical system 5 is defined as being referred to as "exposure means" and this exposure means is denoted by a reference symbol 2.

On the other hand, in FIGS. 1 and 2, the substrate 6 is one that is located on a side with respect to that exposure is performed. Namely, the substrate 6 is one that is manufactured by exposing a desired circuit pattern image onto itself by this exposure apparatus 1. For example, the substrate 6 may be a wafer, a glass plate, or the like having a photoresist coated thereon.

Also, the data-processing device 8 performs signal processing with respect to the circuit pattern data read out from the circuit pattern storage device 7 in such a way as to divide this data into a plurality of region data according to that data as described above. Here, the region data represent individual items of data corresponding to the respective divisional, or divided, regions in case having divided into a plurality of these divisional, or divided, regions the entire region of a single circuit pattern image that is represented by a given unit of circuit pattern data.

Explaining the divisional signal processing that is performed by the data-processing device 8 of the exposure apparatus 1 of this embodiment by taking an example therefor up, the relevant contents thereof are as follows.

Figure 3:
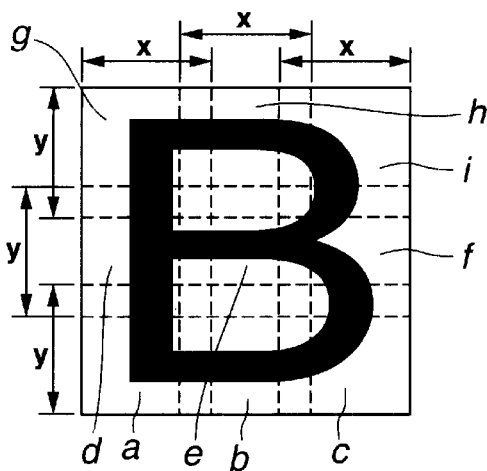
FIG. 3 is a view that is for explaining divisional signal processing of a data processing device of the exposure apparatus in FIG. 1 and that illustrates an original image that is represented by circuit pattern data.
Figure 4:
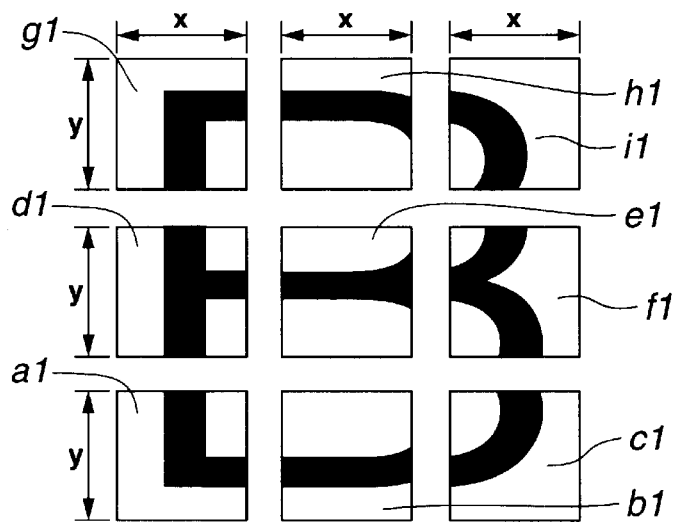
FIG. 4 is a view that is for explaining divisional signal processing of the data processing device of the exposure apparatus in FIG. 1 and that illustrates individual divided regions by their being arrayed in case having divided the original image of FIG. 3 into a plurality of regions at their prescribed division positions.
Figure 5:
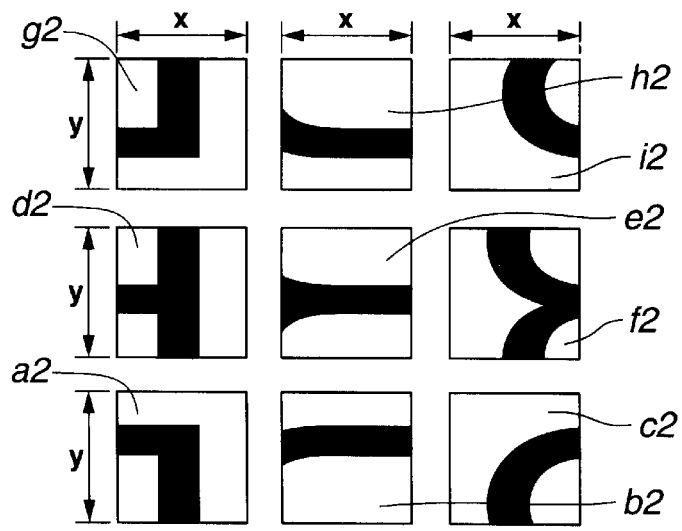
FIG. 5 is a view that is for explaining divisional signal processing of the data processing device of the exposure apparatus in FIG. 1 and that illustrates inverted images that are displayed in the display region of an image display device (LCD)
Figure 6:
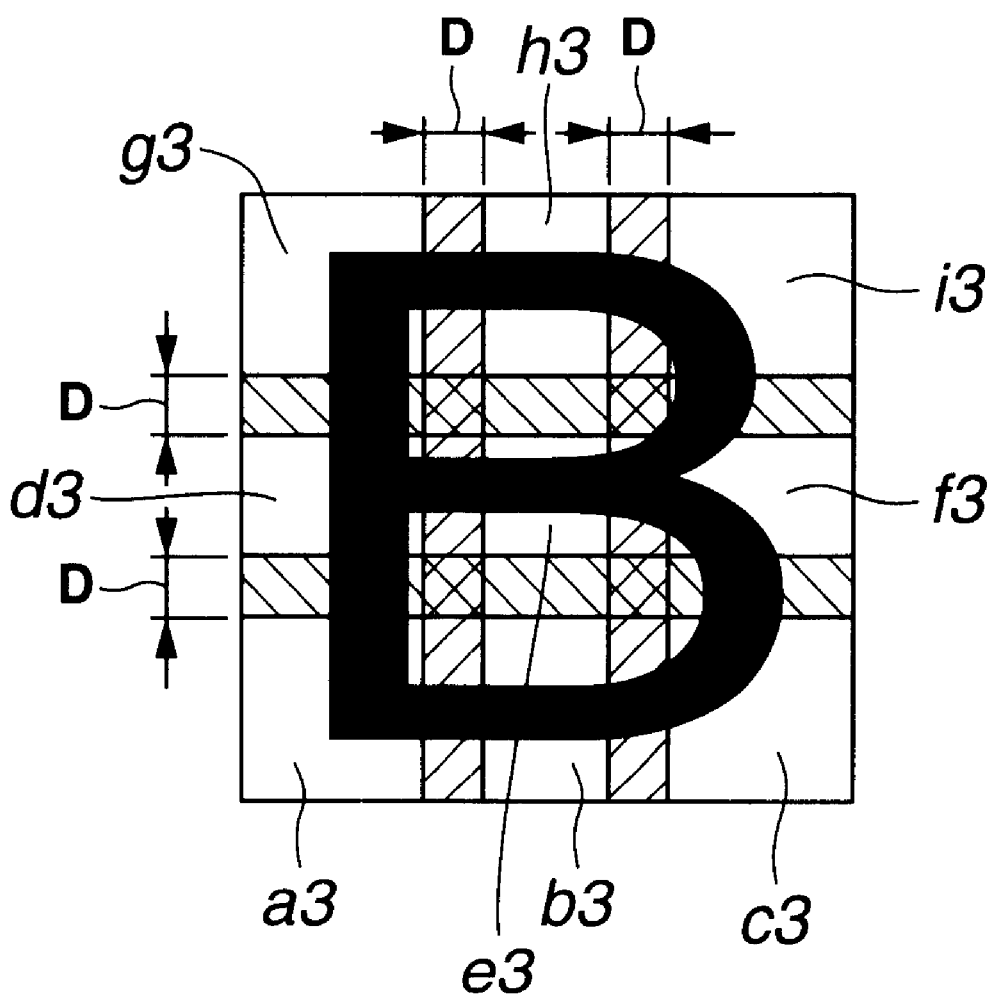
FIG. 6 is a view that is for explaining divisional signal processing of the data processing device of the exposure apparatus in FIG. 1 and that illustrates as a magnified image the circuit pattern that is projected onto the substrate according to the inverted image of FIG. 4.

FIGS. 3, 4, 5, and 6 are views illustrating the divisional signal processing that is performed by the data-processing device 8. FIG. 3 is the illustration of an original image that is represented by the circuit pattern data. FIG. 4 is the illustration of individual divisional regions that are obtained when having divided the original image of FIG. 3 into a plurality of regions at prescribed dividing positions. Also, FIG. 5 is a view illustrating inverted images that are displayed in the display regions of the image display device (LCD). And, FIG. 6 illustrates a magnified image that is the circuit pattern image that is projected onto the substrate according to the inverted images of FIG. 4.

The data-processing device 8 reads out a given unit of circuit pattern data from among a plurality of the circuit pattern data that are stored in the circuit pattern storage device 7. The circuit pattern data that has been thus read out is one that is obtained by converting such a single circuit pattern as illustrated in, for example, FIG. 3 to data by the use of prescribed means.

The data-processing means 8 performs divisional signal processing with respect to that circuit pattern data so as for it to become a plurality of regions, i.e. nine regions in this embodiment at prescribed dividing positions illustrated in dot lines of, for example, FIG. 3. When performing the divisional signal processing, those dividing positions are defined so that respective parts of adjacent ones of the divisional regions may overlap each other. And, each of the thus-divided divisional regions becomes a region that has a range that is defined by the vertical/horizontal lines=x*y as illustrated in FIGS. 3 and 4 for example.

Accordingly, assuming that the symbols a, b, c, d, e, f, g, h, and i represent the respective divisional regions of the original image illustrated in FIG. 3, a plurality of divisional regions corresponding thereto are a1, b1, c1, d1, e1, f1, g1, h1, and i1, respectively.

In the exposure apparatus 1 of this embodiment, as stated previously, the display region of the image display device 4 that has been illuminated by the illumination device 3 is magnified using the magnifying projection optical system 5. And, that magnified image is projected onto the surface of exposure of the substrate 6. Accordingly, the image that is projected via the magnifying projection optical system 5 becomes a so-called inverted image in a state where the image is inverted vertically and horizontally. Taking this into consideration, in this embodiment, the image that is displayed in the display region of the image display device 4 is made to be an inverted image such as that illustrated in FIG. 5 beforehand. Accordingly, because it results that the inverted image of FIG. 5 is projected via the magnifying projection optical system 5, the image projected onto the surface of exposure of the substrate 6 is resultantly made to have a form of erect/normal image (FIG. 6) as in the case of the original image (FIG. 3).

Namely, in the respective liquid crystal display panels 4a, - - - , 4i of the image display device 4, respective ones of the images corresponding to the divisional regions are displayed as the inverted forms of images. Namely, a plurality of the inverted images that are respectively displayed in the respective liquid crystal display panels 4a, - - - , 4i of the image display device 4 at that time are as illustrated in FIG. 5.

Accordingly, in the respective ones of the liquid crystal display panels 4a, - - - , 4i of FIG. 2, there are displayed the respective inverted images indicated by the symbols a2, b2, c2, d2, e2, f2, g2, h2, and i2 of FIG. 5.

And, the respective display images illustrated in FIG. 5 are magnified by respective lenses 5a, - - - , 5i of the magnifying projection optical system 5 and these display images are projected onto the surface of exposure of the substrate 6. The images projected in this case reach the surface of exposure of the substrate 6 via a plurality of the lenses 5a, - - - , 5i, where a prescribed single unit of circuit pattern image such as that illustrated in FIG. 6 is displayed.

That is, when the respective inverted images indicated by the symbols a2, - - -, i2 of FIG. 5 are displayed in the liquid crystal display panels 4a, - - - , 4i and when the beams of light representing these displayed images reach the substrate 6 via a plurality of the lenses 5a, - - - , 5i, divisional region images are displayed in their respective regions represented by the symbols a3, b3, c3, d3, e3, f3, g3, h3, and i3 of FIG. 6.

It is to be noted that the image projected finally on the surface of exposure of the substrate 6 is in a form wherein the original image of FIG. 3 is magnified as illustrated in FIG. 6. Also, in this embodiment, as stated previously, between adjacent ones of the divisional region images there are defined the divisional regions so that respective parts (the portions indicated by the symbol D in each of FIGS. 1 and 6) of those adjacent divisional images, which overlap each other, may exist.

In the regions wherein a plurality of the display images overlap each other in the above-described way, there is a case where, for example, compared to the regions where no overlap occurs, the luminance, etc. of the image inconveniently differ according to the region. This inconveniently causes the deterioration of the quality of the entire display image, etc.

Therefore, in the exposure apparatus of this embodiment, regarding the images in the image-overlapped region, the above-described problem is solved using, for example, a so-called image lamination technique the present Applicant previously proposed in Japanese Patent Application Laid-Open No. 9-326981.

And, in this embodiment, at the time of the exposure operation, prescribed operations are performed in a state where the exposure means 2 and the substrate 6 are relatively fixed to each other. Namely, in the exposure means 2 of this embodiment, the whole of the regions to be exposed with respect to the substrate 6 can be exposed through the exposure operation that is performed only once.

As explained above, according to the first embodiment, the reticle, serving as the original substrate, which represents the circuit pattern to be exposed onto the surface of exposure of the substrate 6 that is a member to be worked, is formed using the liquid crystal display device 4 comprised of the display devices (liquid crystal panels) in place of the conventional glass substrate or the like. In addition, this liquid crystal display device 4 is constructed of a plurality of the liquid crystal display panels 4a, - - - , 4i each having a general size.

In correspondence with this, the single unit of circuit pattern to be exposed is divided into a plurality of the regions, and these divisional regions are displayed by their respective liquid crystal display panels 4a, - - - , 4i. Then, those divisional regions are projected onto the substrate 6 in a magnified form of their being magnified respectively by the lenses 5a, - - - , 5i of the magnifying projection optical system 5.

And, the images of the respective divisional regions are set so that respective parts of adjacent ones thereof may overlap each other. And, these respective parts of those adjacent region images are accurately laminated one over the other using the image lamination technique and are thereby formed into an accurately continued image representing the single unit of circuit pattern. Thereby, the resulting image is projected onto the surface of exposure of the substrate 6.

Accordingly, as a result of this, even when using the liquid crystal display device 4 in place of the conventional reticule such as a glass substrate, it is possible to ensure a wider region of display area without deteriorating the resolution. Accordingly, even a more finely designed circuit pattern can be formed on the surface of exposure of the substrate 6 as an image having a sufficiently high value of resolution.

In this case, as a plurality of the liquid crystal display panels 4a, - - - , 4i that constitute the liquid crystal display device 4 and that serve as the display devices, it is arranged to use inexpensive ones that have been generally diffused. Therefore, constructing the exposure apparatus very cheaply while ensuring a high value of resolution is easily possible. This can contribute to reducing the manufacturing cost of the exposure apparatus.

Next, the exposure apparatus according to a second embodiment of the present invention will hereafter be explained with reference to a schematic construction view of FIG. 7. The construction of this embodiment is made up in substantially the same way as in the above-described first embodiment. Accordingly, the members which have the same construction as in the above-described first embodiment are denoted by like reference symbols and a detailed explanation thereof is omitted.

The exposure apparatus 1A of this embodiment comprises a circuit pattern storage device 7 that is memory means, a data-processing device 8 that is data-processing means, a Fourier transform device 9 that is Fourier transform means that is comprised of a plurality of Fourier transform units (9a, 9b, 9c, - - - ) each of that two-dimensionally performs electrical Fourier transform processing with respect to each relevant region data that is output after having been subjected to divisional signal processing of the data-processing device 8, the Fourier transform unit thereby calculating a Fourier transform processed image of the two-dimensional divisional region image represented by the region data and outputting that Fourier transform processed image to the image display device 4, a liquid crystal display device (LCD) 4 that is image display means that receives respective ones of the outputs of the Fourier transform units (9a, 9b, 9c, - - - ) and that respectively can display the Fourier transform processed images corresponding to the respective divisional regions to be exposed, which liquid crystal display device 4 is comprised of a plurality of liquid crystal display panels (4a, 4b, 4c, - - - ), a coherent light source 3A that is illumination means for respectively illuminating a plurality of the liquid crystal display panels (4a, 4b, 4c, - - - ) constituting the image display device 4 and that is comprised of a plurality of coherent illuminators (3Aa, 3Ab, 3Ac, - - - ) each of which emits a coherent light beam such as a laser light beam, beam expanders (10a, 10b, and 10c) respectively expand the coherent lights emitted from a plurality of the coherent illuminators (3Aa, 3Ab, 3Ac, - - - ) constituting the coherent light source 3A and that convert the resulting coherent lights to parallel lights, and a plurality of inverse Fourier transform lenses (41a, 41b, and 41c) constituting an inverse Fourier transform optical system 41 for performing optical inverse Fourier transform processing with respect to the coherent lights that have passed through the displayed images of the respective liquid crystal display panels (4a, 4b, 4c, - - - ).

And, in the exposure apparatus 1A of this embodiment, an arrangement comprised of the coherent light source 3A, beam expanders 10, inverse Fourier transform optical system 41, image display device 4, etc. constitute exposure means 2A.

Figure 7:
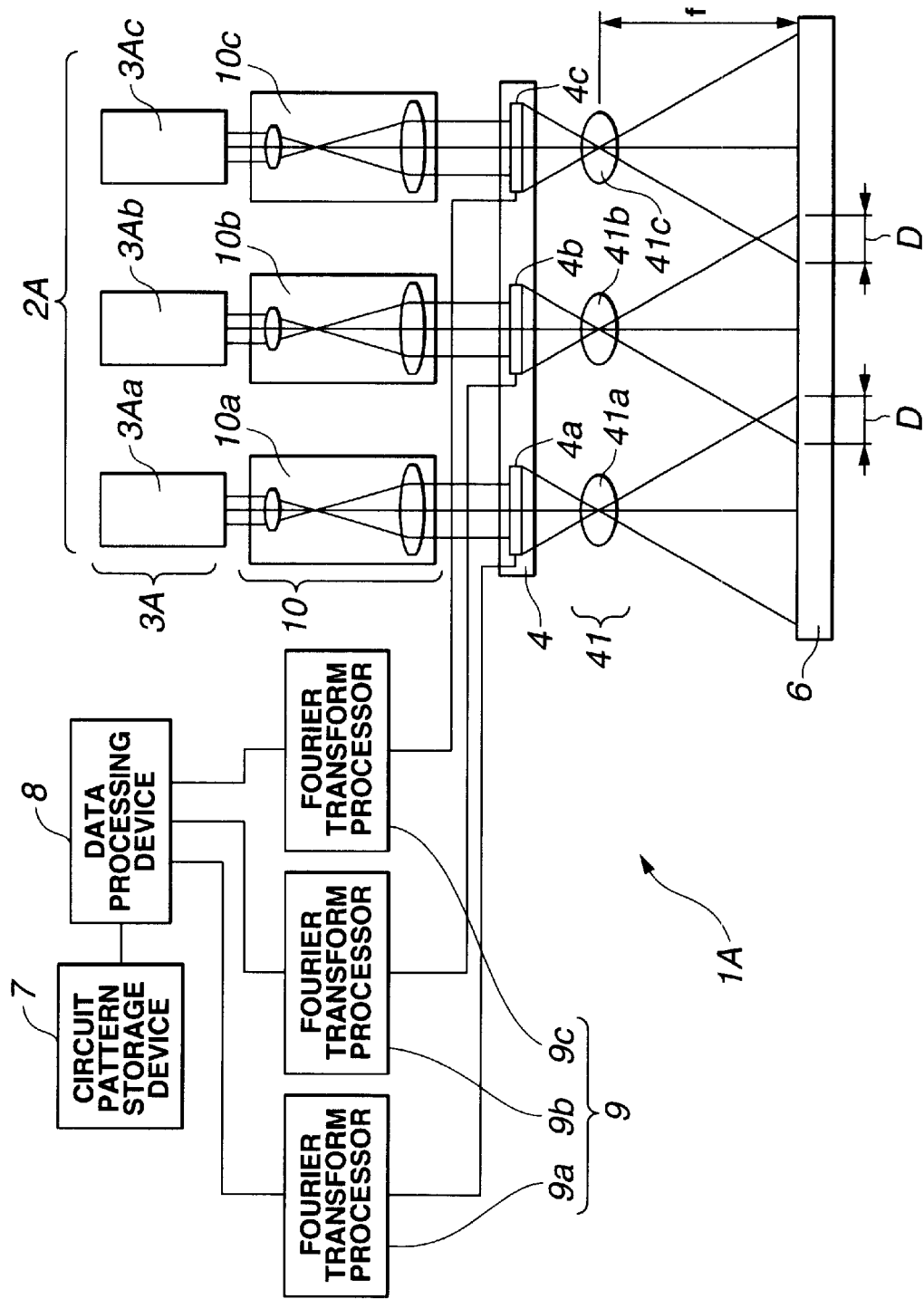
FIG. 7 is a schematic construction view illustrating the exposure apparatus according to a second embodiment of the present invention.

It is to be noted that the symbol f in FIG. 7 represents a focal distance of each of the respective lenses (41a, 41b, and 41c) of the inverse Fourier transform optical system 41. Namely, the surface of exposure of the substrate 6 is disposed at the position that is spaced by the distance f from each of the main-point positions of the respective lenses 41a, 41b, and 41c of the inverse Fourier transform optical system 41.

Also, in FIG. 7, the Fourier transform units 9a, 9b, and 9c of the Fourier transform device 9, the coherent illuminators 3Aa, 3Ab, and 3Ac of the coherent light source 3A, the inverse Fourier transform lenses 41a, 41b, and 41c of the inverse Fourier transform optical system 41, and the liquid crystal display panels 4a, 4b, and 4c of the liquid crystal display device (LCD) 4 are each shown only three in number. However, it is arranged that the respective constituent members are disposed in a column/row fashion of, for example, vertical 3 columns=horizontal 3 rows.

And, the respective coherent illuminators 3Aa, 3Ab, 3Ac, - - - and respective beam expanders 10a, 10b, 10, - - - , and the respective liquid crystal display panels 4a, 4b, 4c, - - - ) are disposed being co-axially arrayed with the optical axes of the respective lenses 41a, 41b, 41c, - - - of the inverse Fourier optical system 41.

Here, the flow of the division processing performed in the data-processing device 8 and the flow of the electrical Fourier transform processing performed in the Fourier transform device 9 will briefly be explained below with reference to FIGS. 8A, 8B, 8C, and 8D.

Figure 8:
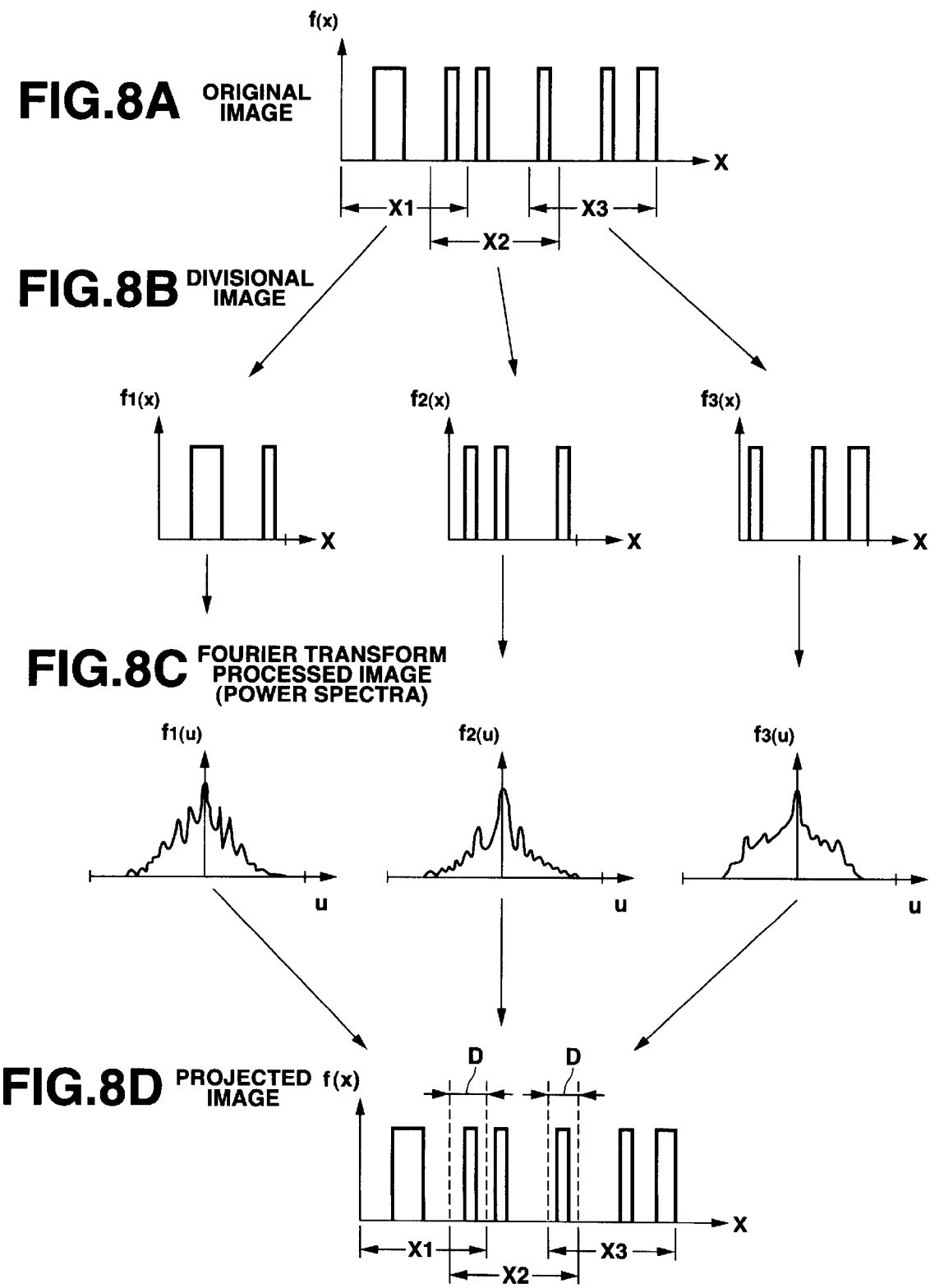
FIG. 8A is a view that is for explaining the flow of the division processing performed by the data processing device in the exposure apparatus of FIG. 7 and the electrical Fourier transform processing performed by the Fourier transform device in it and that briefly represents the original image resulting from the circuit pattern data stored in the circuit pattern storage device.
FIG. 8B is a view that is for explaining the flow of the division processing performed by the data processing device in the exposure apparatus of FIG. 7 and the electrical Fourier transform processing performed by the Fourier transform device in it and that briefly represents the divisional region images after performing the division processing.
FIG. 8C is a view that is for explaining the flow of the division processing performed by the data processing device in the exposure apparatus of FIG. 7 and the electrical Fourier transform processing performed by the Fourier transform device in it and that briefly represents the Fourier transform processed image (power spectra) after performing Fourier transform processing.
FIG. 8D is a view that is for explaining the flow of the division processing performed by the data processing device in the exposure apparatus of FIG. 7 and the electrical Fourier transform processing performed by the Fourier transform device in it and that briefly represents the projection image that is projected on the substrate.

FIGS. 8A to 8D are views illustrating the flows of the pieces of processing of the image data. FIG. 8A illustrates the original image based on the circuit pattern data that is stored in the circuit pattern storage device 7; FIG. 8B illustrates the divisional region images after the division processing has been performed; FIG. 8C illustrates the Fourier transform processed images (power spectra) after the Fourier transform processing has been performed; and FIG. 8D illustrates sketches that simply show the projection images that are projected on the substrate. It is to be noted that, in the following explanation, for brevity of the explanation, examples where each are taken up only in one-dimensional direction (x direction) are illustrated.

Because the circuit pattern data that is stored in the circuit pattern storage device 7 is digital data, the original image can be expressed as high and low luminance binarized data as illustrated in FIG. 8A.

Namely, in the ordinary original substrate (reticule), using a metal film or the like on the substrate such as that made of glass, there are formed on it high and low luminance binarized images that consist of a portion permitting the passage of the beam of light and a portion stopping the passage of the beam of light, whereby the circuit pattern is formed on it as those binarized images. Accordingly, when converting such original image to a form of data, it is easy to handle the original image as digital data representing the high and low luminance, or dark and bright, binarized data.

Here, the original image data illustrated in FIG. 8A is divided into a plurality of regions x in such a way that prescribed adjacent regions thereof overlap each other. Here, in this embodiment, illustration is made of a case where the original image data is divided into three regions x1, x2, and x3. Illustrating the divisional region images after division, they are as illustrated in FIG. 8B. The processing up to there is performed in the data-processing device 8.

The data-processing device 8 outputs respective ones of those divisional region image data to the Fourier transform device 9. Upon receipt of them, the Fourier transform device 9 operates so that the respective divisional region image data may be input to their corresponding Fourier transform units 9a, 9b, and 9c. Those divisional region image data are each subjected to prescribed electrical Fourier transform processing. Resultantly, the Fourier transform image data such as those illustrated in FIG. 8C are obtained.

These Fourier transform processed image data are output to the image display device 4, whereby the images corresponding to the respective data are displayed on their respective liquid crystal display panels 4a, 4b, and 4c. At this time, these liquid crystal display panels 4a, 4b, and 4c demodulate the intensities and phases of the illumination lights that are emitted from the coherent illuminators 3Aa, 3Ab, and 3Ac of the coherent light source 3A via the beam expanders 10a, 10b, and 10c.

And, the thus-demodulated light beams are projected onto the surface of exposure of the substrate 6 via the inverse Fourier transform optical system 41 and the projection image illustrated in FIG. 8D is formed. This projection image is formed as the same image as the original image illustrated in FIG. 8A by being projected via the inverse Fourier transform optical system 41 as stated previously. It is to be noted that, in FIG. 8D, the symbol D indicates the overlapping regions each set between the adjacent images.

However, although, in the above-described FIG. 8C, the results of the Fourier transform processings are illustrated as the power spectra, the calculation that is performed when the Fourier transform processings are performed in the Fourier transform device 9 is actually performed using complex amplitudes.

Figure 9:
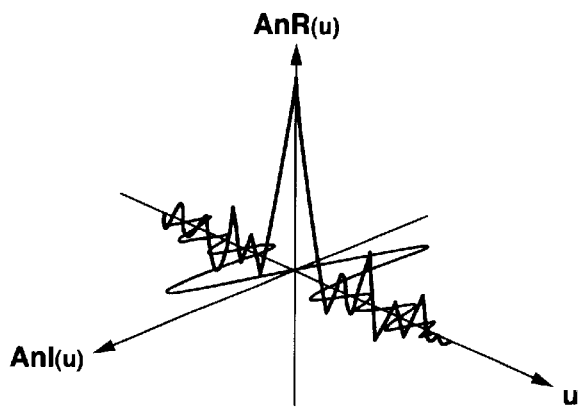
FIG. 9 is a view illustrating in more detail the result that is obtained after performing the electrical Fourier transform processing by the exposure apparatus of FIG. 7.

Namely, in more detail, the results that are obtained after those electrical Fourier transform processings have been performed are as illustrated in FIG. 9.

The Fourier transform processed images (power spectra) illustrated in FIG. 8C are ones that have been expressed using the absolute values by more simplifying the expression of FIG. 9. In FIG. 9, the axes that are indicated by the symbol u represent the co-ordinate axes that are to be displayed in the image display device 4.

Figure 10:
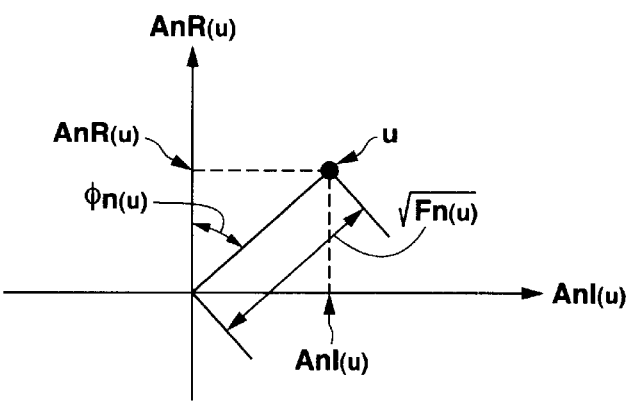
FIG. 10 is a view illustrating given values u that have been taken out in FIG. 9.

For example, in a case of taking out a given value u in FIG. 9 and showing it, that value can be expressed as illustrated in FIG. 10. Namely, in FIG. 10, the abscissa axis AnI(u) represents imaginary numbers and the ordinate axis AnR(u) represents real numbers. Accordingly, the value obtained by performing Fourier transform with respect to the given value u is expressed as a complex number (AnI(u), AnR(u)).

Also, the symbol $\phi_n(u)$ represents the phase angle that corresponds to the given value u. And, the value that is exhibited at this time is expressed as $\sqrt{Fn(u)}$. In this way, the transmittance and phase of each pixel in each of the respective liquid crystal display panels 4a, 4b, and 4c are given, respectively, as Fn(u) and $\phi_n(u)$.

The transmittance Fn(u) can be determined as follows. Namely, $$Fn(u) = A_{nR}(u)^2 + A_{nI}(u)^2$$

In the recent generally-used exposure apparatus, there is sometimes a case where a technique of what is called "a phase shifter mask" is used wherein a light transmission permission region and a light transmission inhibition region are not only provided on the reticule but a phase difference is partially imparted to light (and the light is thereby inverted), thereby causing the transmission of the light.

Figure 11A:
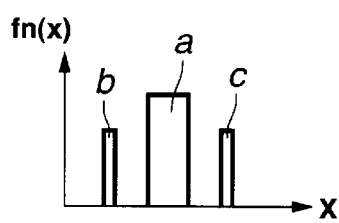
FIG. 11A is a view that when explaining the flow of the electrical Fourier transform processing performed by the Fourier transform device in the exposure apparatus of FIG. 7 explains the flow of data processing of part of the image data with this part being taken out, and that illustrates the intensity distribution of the original image.
Figure 11B:
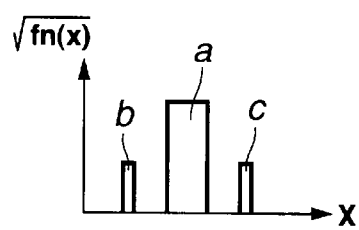
FIG. 11B is a view that when explaining the flow of the electrical Fourier transform processing performed by the Fourier transform device in the exposure apparatus of FIG. 7 explains the flow of data processing of part of the image data with this part being taken out, and that illustrates the electric-field intensity distribution.
Figure 11C:
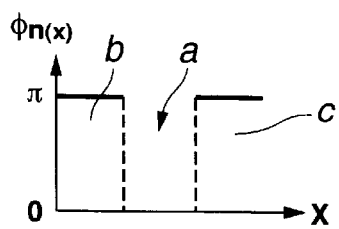
FIG. 11C is a view that when explaining the flow of the electrical Fourier transform processing performed by the Fourier transform device in the exposure apparatus of FIG. 7 explains the flow of data processing of part of the image data with this part being taken out, and that illustrates a phase shifter mask wherein phase distribution is given in the x direction.

FIGS. 11A to 11C are views each illustrating the flow of data processing the data of that is taken-out part of the image data as in the case of FIGS. 8A to 8D. FIG. 11A is a view illustrating the intensity distribution of the original image; FIG. 11B is a view illustrating the electric-field distribution; and FIG. 11C is a view illustrating a phase shifter mask wherein the phase distribution is given in the x direction.

In FIGS. 11A–11C, the region indicated by the symbol a exhibits the operation wherein light is totally transmitted. The regions that are indicated by the symbols b and c exhibit the operation wherein light is transmitted with its phase being inverted. And, the remaining region exhibits the operation wherein the transmission of light is inhibited. In this case, in the regions indicated by the symbols b and c, the intensity fn(x) is lower than in the region indicated by the symbol a. The reason for this is that, in order to enable the image, that is to be projected, to be reliably focused, the operation for causing the transmittance thereof to become partly lower is performed.

In case the intensity fn(x) has not binary values but half tone values, in order to perform electrical Fourier transform processing, it is necessary to determine the square root (the electric-field distribution) of the intensity distribution. And, there is the need to execute the processing according to the result of that square root (refer to FIG. 11B).

In the second embodiment that has been constructed in this way, also, it is possible to obtain the same effect as is attainable with the above-described first embodiment.

Incidentally, in the image display means of second embodiment, light is emitted from the light source of coherent light such as a laser beam. And, it is arranged that that light then is illuminated onto the surface of exposure of the substrate 6 via the beam expander, image display device, and inverse Fourier transform optical system. However, for example, it is also possible to make the light source an incoherent light source. In this case, it is only needed to control the output of the light source so as to enhance the coherence of the light via a spatial filter or the like.

Next, a third embodiment of the present invention will hereafter be explained. This embodiment has approximately the same construction as that of the above-described first embodiment. However, in this third embodiment, there is provided moving means for two-dimensionally moving the magnifying projection optical system. And, this magnifying projection optical system is two-dimensionally moved in a flat plane that opposes the substrate becoming an object to be exposed. It is thereby arranged to cause a desired circuit pattern image to be exposed onto a prescribed surface of exposure of the substrate.

Figure 12:
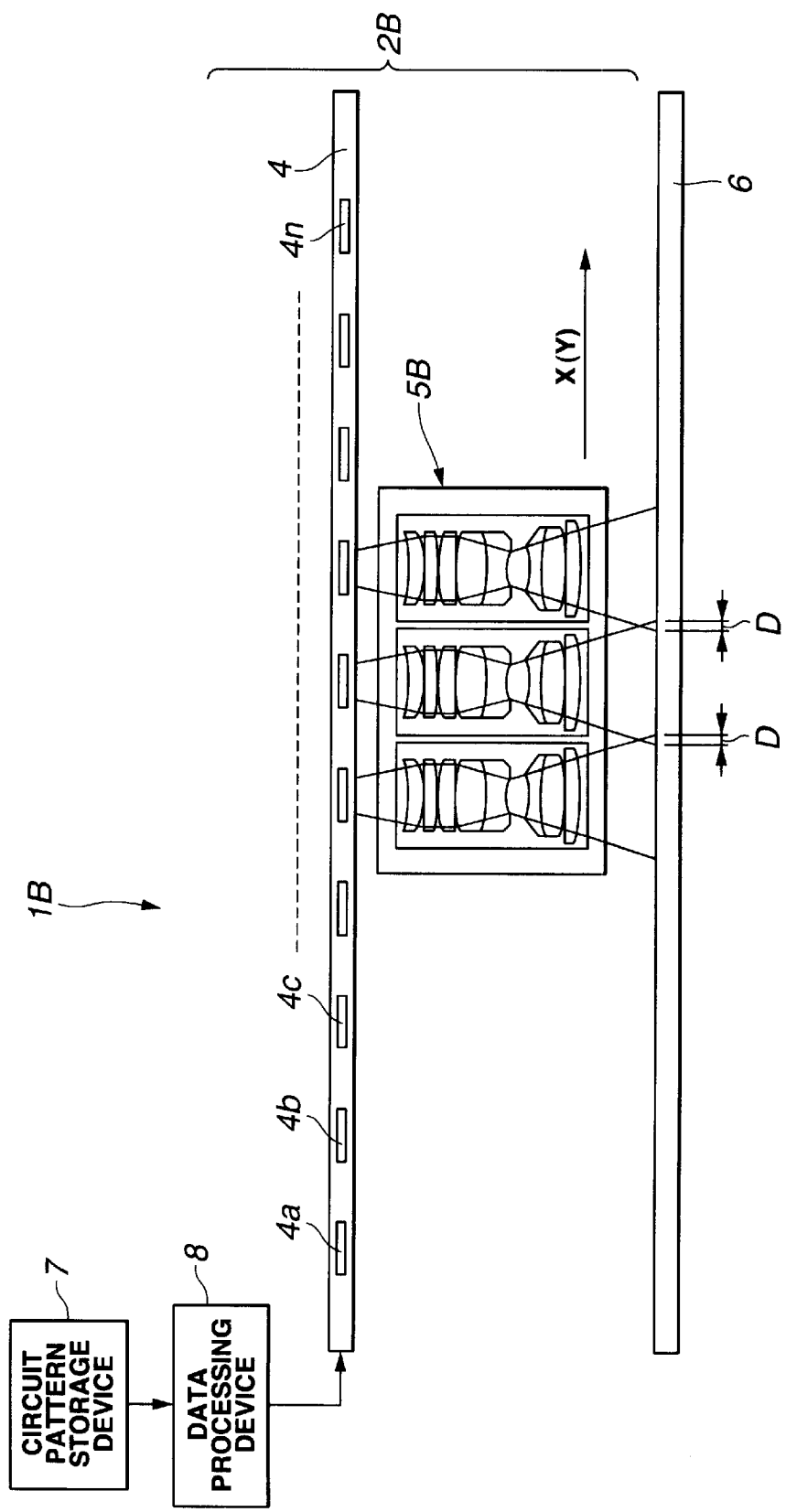
FIG. 12 is a schematic construction view illustrating the exposure apparatus according to a third embodiment of the invention.

FIG. 12 is a schematic construction view illustrating a schematic construction of the exposure apparatus according to the third embodiment of the invention.

As illustrated in FIG. 12, the main constituent members that constitute the exposure apparatus 1B of this embodiment are substantially the same as in the above-described first embodiment. However, this embodiment differs from the first embodiment in that only the magnifying projection optical system 5 alone is provided being unified and made movable in this unified state.

Namely, this magnifying projection optical system unit 5B is so arranged as to be two-dimensionally moved, within a prescribed flat plane that opposes the substrate 6, by moving mechanism (not illustrated) that is prescribed moving means that is formed of a motor or the like. In this case, the illumination device (not illustrated) and image display device 4 constituting the exposure means 2B, and the substrate 6 that is an object to be worked on a side where exposure is performed, are in a state of their being made fixed.

As stated previously, in the above-described first embodiment, during the exposure operation, the exposure means 2 including the magnifying projection optical system 5, and the substrate 6, are arranged so that both may perform their prescribed operation in a state of their being relatively made fixed to each other. And, it is thereby arranged that the whole of the region to be exposed, i.e. a single unit of circuit pattern image be exposed through the exposure operation that is performed once.

In contrast to this, in this third embodiment, the range that can be exposed through the exposure operation that is performed once is arranged to fall upon only a part of the whole region to be exposed onto the substrate 6. Namely, it is arranged that the exposure operation is performed a plurality of times while moving the unified magnifying projection optical system 5B in the arrow-indicated X direction or the arrow-indicated Y direction of FIG. 12, i.e. moving the system 5B within a prescribed two-dimensional flat plane. It is thereby arranged that a single unit of circuit pattern image be exposed over the whole prescribed region of the substrate 6. In this case, in the image display device 4, it is arranged that a plurality of the liquid crystal display panels 4a, 4b, 4c, - - - , 4n be disposed with respect to a prescribed range capable of covering the whole of the prescribed substrate 6. And, it is thereby arranged that the single unit of circuit pattern image to be exposed be displayed at all times and as a whole.

By constructing according to the third embodiment, there is brought about the merit that can simplify the construction of the magnifying projection optical system 5B. That is to say, in this embodiment, the construction of the magnifying projection optical system 5B is simplified compared to that of each of the above-described first and second embodiments. Thereby, it is possible to lessen the number of the members constituting the system 5B. Resultantly, it is possible to easily realize the reduction in the number of steps at the time of manufacture and the reduction in the manufacturing cost. That therefore can contribute to decreasing the manufacturing cost of the exposure apparatus 1B itself.

Next, a fourth embodiment of the present invention will hereafter be explained. This fourth embodiment has substantially the same construction as that of the above-described first embodiment. However, in this fourth embodiment, the exposure means is constructed being unified and, in addition, there is provided moving means for two-dimensionally moving this unified exposure means. It is thereby arranged that the exposure means (the unit) be moved in a two-dimensional flat plane that opposes the substrate becoming an object of exposure. It is thereby arranged that a desired single unit of circuit pattern image be projected onto the surface of exposure of the substrate and exposed.

Figure 13:
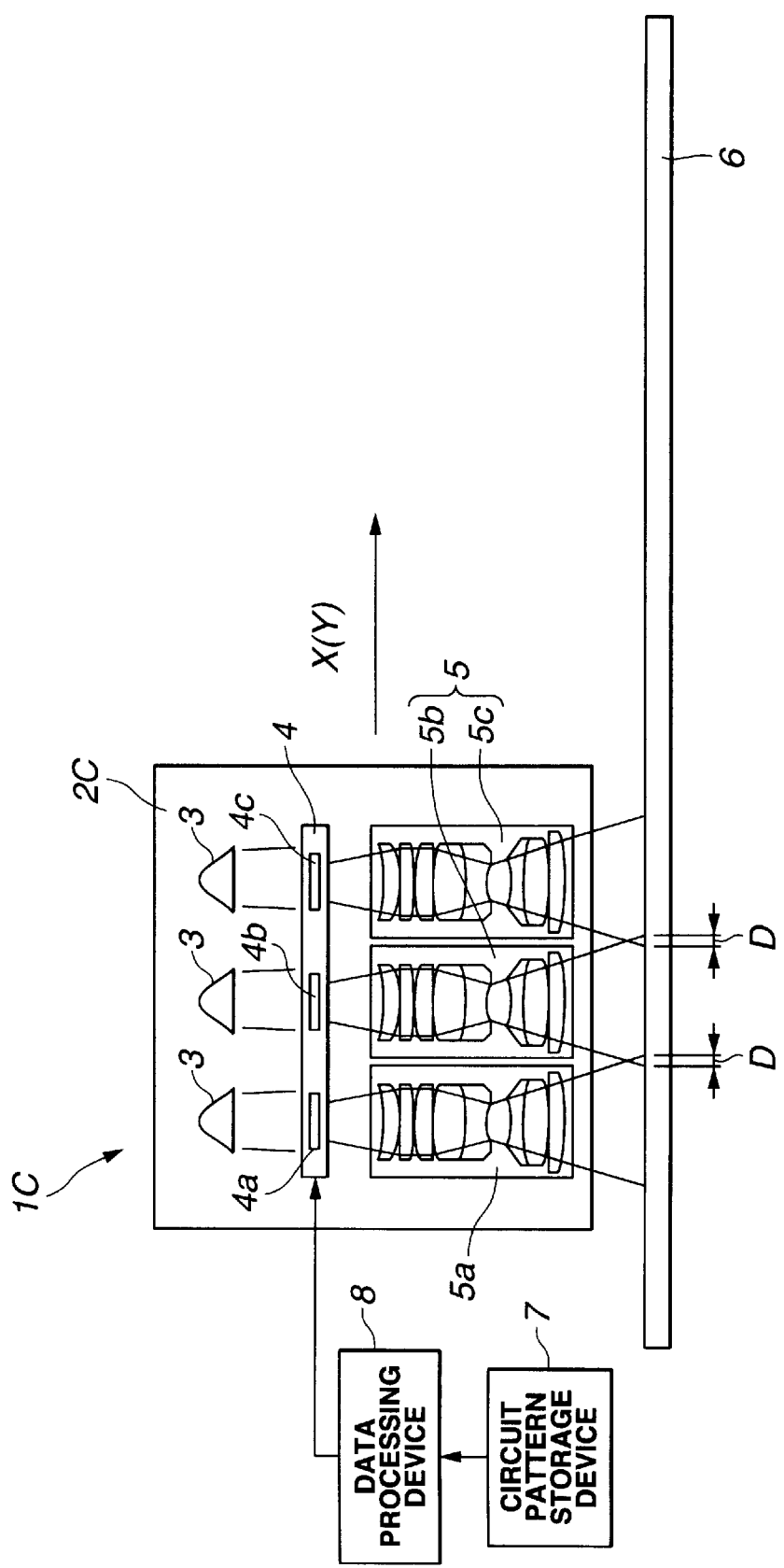
FIG. 13 is a schematic construction view illustrating the exposure apparatus according to a fourth embodiment of the invention.

FIG. 13 is a view illustrating the construction of the exposure apparatus according to the fourth embodiment of the present invention.

As illustrated in FIG. 13, the main constituent members constituting the exposure apparatus 1C of this embodiment are substantially the same in construction as those of the above-described first embodiments. But this fourth embodiment differs therefrom in that exposure means 2C comprised of the illumination device 3, image display device 4, and magnifying projection optical system 5 is constructed being unified and the resulting exposure means unit (2C) is disposed in such a way as to be freely movable.

This exposure means unit (2C) is constructed in such a form as can be moved within a prescribed two-dimensional flat plane taken with respect to the substrate 6 by a moving mechanism (not illustrated) that is prescribed moving means that is formed of a motor or the like.

Also, the exposure means unit (2C) of this fourth embodiment is constructed so that, at the time of the exposure operation, the unit (2C) exposes a partial region of the whole region to be exposed of the substrate 6 through the exposure operation that is performed once as in the above-described third embodiment. And, the exposure means unit (2C) executes a plurality of the exposure operations with respect to the fixed substrate 6 while being two-dimensionally moved within a prescribed flat plane that opposes the substrate 6. It is thereby arranged that the exposure with respect to the whole of a prescribed region of the substrate 6 be performed. In this case, in the image display device 4, it is arranged that, during the individual exposure operations, the images in respective regions corresponding to the exposure regions each becoming an object to be exposed be displayed by a plurality of liquid crystal display panels 4a, 4b, and 4c, respectively. And, following the movement of the exposure means unit (2C), control is so performed that, for each movement thereof, the display of each of the liquid crystal display panels 4a, 4b, and 4c may be changed over. This control of changeover of the display is performed through the operation of, for example, data-processing device 8.

By constructing according to the fourth embodiment, there is brought about the merit of enabling the simplification of the construction of the exposure means unit (2C). This provides the advantage of making it possible to realize a further reduction in the number of steps at the time of manufacture as well as in the manufacturing cost. This advantageously enables contributing to a further reduction in the manufacturing cost of the exposure apparatus 1C itself.

In the third embodiment, the unified magnifying projection optical system 5B is being moved, and in the fourth embodiment, the exposure means unit 2C that has been integrally constructed, the exposure operation is performed a plurality of times to thereby expose a single unit of circuit pattern image. Namely, it is arranged that, in either case, following the exposure operation performed with respect to the substrate 6, the magnifying projection optical system 5B or the exposure means unit 2C is moved.

In a case of performing the exposure operation while moving the magnifying projection optical system 5B or exposure means unit 2C for use for projecting a magnified image onto the surface of exposure of the substrate 6 in the above-described way, there is also considered to occur a case where each of the respective display images that are projected onto the substrate 6 following the performance of that exposure operation fails to be projected at its relevant prescribed position.

On this account, in each of the third and fourth embodiments, in order to cause each of the respective display images, which are displayed in the respective liquid crystal display panels 4a, 4b, 4c, - - - of the image display device 4, to be reliably projected onto a prescribed position on the surface of exposure of the substrate 6 and thereby to cause a single unit of circuit pattern image to be accurately exposed with respect to the substrate 6, it is necessary to use correction means for correcting the positional displacement of each image.

In each of the third and fourth embodiments, the data-processing device 8 plays the role of the correction divisional region images that are projected onto the substrate by having provided thereon duplex regions wherein respective parts of those divisional region images may overlap each other between adjacent ones thereof. By this way of projection, a plurality of the divisional region images are projected onto the substrate continuously, i.e. without intermission. The single unit of circuit pattern image is thereby formed on the substrate.

Accordingly, using the means that is disclosed in the above-cited Japanese Patent Application Laid-Open No. 11-45851 in order to cause the duplex region of the respective divisional region images to be projected in such a way as to be accurately overlapped one over the other becomes very complex and in addition is followed by a large number of operation processes. Therefore, using that means is not efficient. Also, there is the possibility that even when, for example, projecting the respective divisional region images onto prescribed positions on the substrate in alignment with these prescribed positions those duplex regions will not always accurately overlap one over the other.

On this account, in the exposure apparatus according to the invention, as positioning means for positioning one of the divisional region images relative to another, for example, means illustrated in a fifth embodiment referred to next is applied. This fifth embodiment will hereafter be explained.

Figure 14:
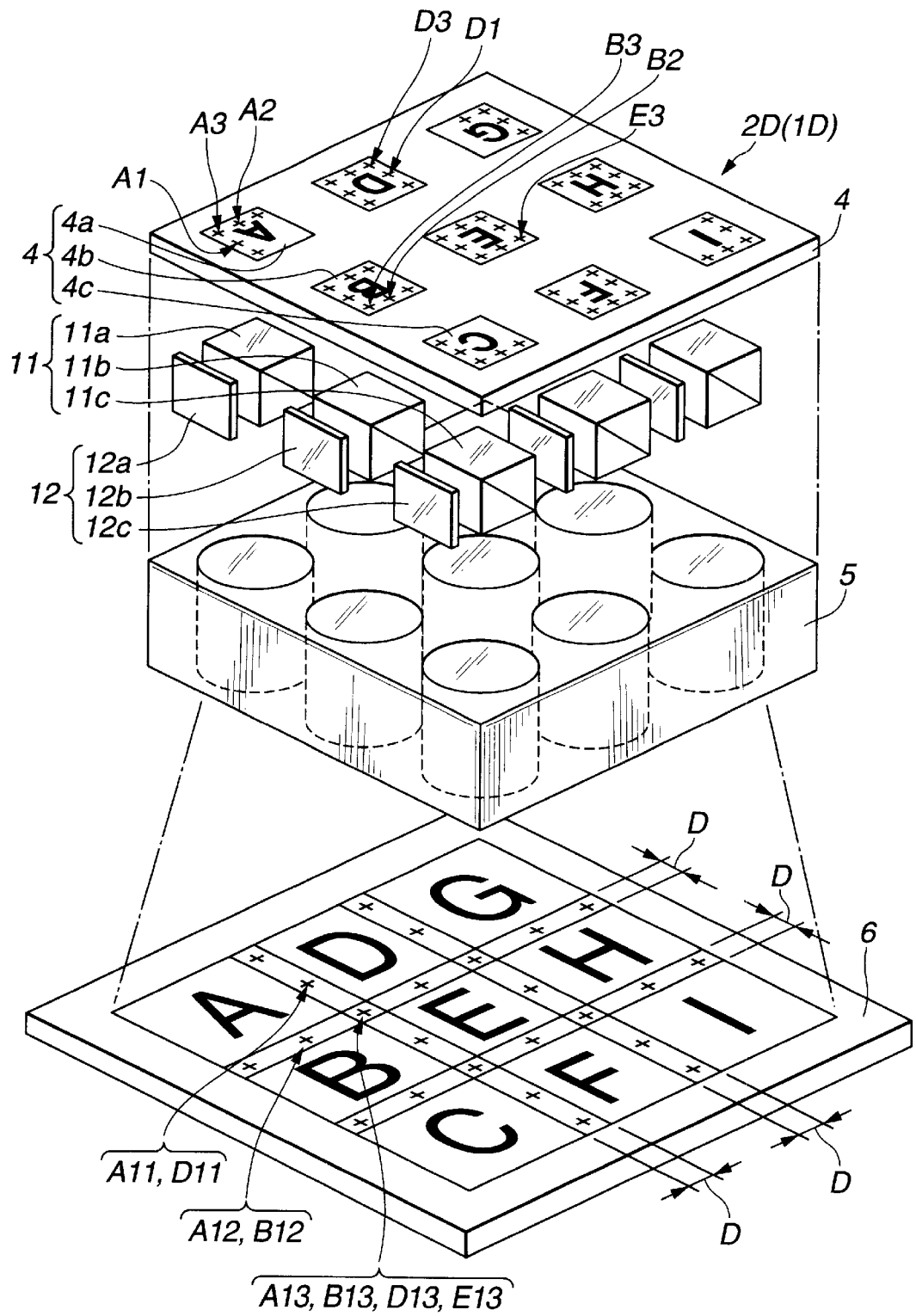
FIG. 14 is a main-part exploded perspective view illustrating the construction of a main part of the exposure apparatus according to a fifth embodiment of the invention.

FIG. 14 is an exploded perspective view illustrating a main part of the construction of the exposure apparatus means. Namely, the data-processing device 8, as stated above, performs prescribed signal processing such as divisional signal processing according to the given circuit pattern data that has been read out from the circuit pattern storage device 7. And the data-processing device 8 outputs the resulting signals to the respective liquid crystal display panels 4a, 4b, and 4c of the image display device 4. It is thereby arranged that the respective divisional region images be displayed by their corresponding respective liquid crystal display panels 4a, 4b, and 4c.

Accordingly, in each of the third and fourth embodiments, in the data-processing device 8, there becomes needed further prescribed correction signal processing that is based on the consideration of the positional displacement that follows the movement of the magnifying projection optical system 5B or exposure means unit 2C.

Namely, in each of the third and fourth embodiments, an image that is already corrected is displayed at all times in its relevant one of the liquid crystal display panels 4a, 4b, and 4c of the image display device 4 of the exposure apparatus 1B or 1C according to the data already subjected to prescribed correction signal processing that regards the positional displacement, etc. It is thus arranged that the image, which is projected onto the substrate 6 according to the image that is formed and displayed in that way, be projected at all times onto a prescribed position on the surface of exposure of the substrate 6.

In the conventional exposure apparatus, when projecting the circuit pattern with respect to the substrate, this circuit pattern data is prepared beforehand so as to contain therein a prescribed positioning adjustment indicator, i.e. a so-called alignment mark. And a further consideration is given of the idea of providing a reference-position mark becoming a reference position with respect to a prescribed position on a side of substrate as well with respect to data that circuit pattern is exposed. And, in this case, the conventional exposure apparatus is constructed in such a form as is equipped with positioning means for causing the circuit pattern image projected onto the exposure surface of the substrate 6 to be accurately projected onto a prescribed position on the exposure surface of the substrate 6. This technique is one that is already disclosed in, for example, the above-cited Japanese Patent Application Laid-Open No. 11-45851.

However, in the exposure apparatus of the invention, as previously explained in each of the respective above-described embodiments, the circuit pattern data according to the single unit of circuit pattern to be exposed onto the substrate is divided into a plurality of region data representing a plurality of the divisional region images. And these pluralities of region data are respectively displayed in a plurality of the liquid crystal display panels of the image display device. These displayed images are projected onto the substrate as magnified images via a plurality of the lenses of the magnifying projection optical system. At this time, the respective according to the fifth embodiment of the invention. Also, FIGS. 15A and 15B illustrate a schematic construction of the exposure apparatus of this embodiment. And, FIG. 15A is a schematic construction view while FIG. 15B is a view illustrating part of the projection image that is obtained when having looked at the upper surface of the substrate from the arrow B indicated direction of FIG. 15A.

The basic main construction part of the exposure apparatus 1D of this embodiment has substantially the same construction as that of the first embodiment. That main construction, as illustrated in FIG. 15A, comprises the circuit pattern storage device 7, the data-processing device 8, and exposure means 2D constructed of the illumination device 3 comprised of the illuminators 3a, 3b, 3c, - - - ,the image display device 4 comprised of the liquid crystal display panels 4a, 4b, 4c, - - - , and the magnifying projection optical system 5 comprised of the lenses 5a, 5b, 5c, - - - . That main construction further comprises an imaging device 12 that is image-measuring means 12 comprised of CCDs 12a, 12b, 12c, - - - that get the image projected onto the exposure surface of the substrate 6 as image data and output it to the data-processing device 8, and a beam splitter 11 that is light beam splitting means comprised of a plurality of prisms 11a, 11b, 11c, - - - that each guide to the imaging device 12 the beams of light that are obtained after the light beams having transmitted through the respective liquid crystal display panels 4a, 4b, and 4c of the image display device 4 have been reflected by the substrate 6.

In this embodiment, as illustrated in FIG. 14, there is illustrated an example of the exposure apparatus 1D that is constructed with a form wherein the liquid crystal display panels 4a, 4b, 4c, - - - of the image display device 4 are disposed in a column/row fashion of vertical 3 columns and horizontal 3 rows. Accordingly, in the exposure apparatus 1D of this embodiment, correspondingly to the respective liquid crystal display panels 4a, 4b, 4c, - - - , the same number of lenses 5a, 5b, 5c, - - - , each prisms 11a, 11b, 11c, - - - of the beam splitter 11, and CCDs 12a, 12b, 12c, - - - are respectively provided. The exposure apparatus 1D of this embodiment that has been constructed in such way forms a projection image such as that illustrated, for example, in FIG. 14 or FIG. 15B with respect to the exposure surface of the substrate 6. In this embodiment, for avoiding the complication of the illustration, the divisional region images are shown in alphabetic characters of "A", "B", "C", "D", "E", "F", "G", "H", "I", etc. and these region images as a whole are deemed as being a circuit pattern image.

Namely, a given unit of circuit pattern data is read out from the circuit pattern data that is stored in the circuit pattern storage device 7 by the data-processing device 8. The data-processing device 8 performs prescribed divisional signal processing, etc. with respect to the thus-read-out circuit pattern data and then outputs the resulting data signal to the respective liquid crystal display panels 4a, 4b, 4c, - - - of the image display device 4. As a result of this, the respective divisional region images are display in their corresponding liquid crystal display panels 4a, 4b, 4c, - - - . It is arranged that the respective liquid crystal display panels 4a, 4b, 4c, - - - of the image display device 4 be illuminated by the illuminators 3a, 3b, 3c, - - - . The beams of light that form the display images are transmitted through the respective prisms 11a, 11b, 11c, - - - of the beam splitter 11. The resulting beams of light then are transmitted through the respective lenses 5a, 5b, 5c, - - - of the magnifying projection optical system 5. Thereby, the thus-magnified images are projected on the surface of exposure of the substrate 6 (refer to FIGS. 14 and 15B).

In this case, a plurality of the divisional region images that are projected onto the surface of exposure of the substrate 6 are projected in a state wherein they are arrayed in a column/row fashion. However, in this case, it is arranged that between adjacent ones of the divisional region images there be ensured the duplex regions (in FIGS. 14 and 15B the portions indicated by the symbol D) in each of that the images overlap one over the other within a prescribed range.

In each of these duplex regions, it is necessary that adjacent ones of the divisional region images be projected in a form of their being reliably overlapped upon each other. Accordingly, in the duplex regions corresponding to the respective divisional region images, there are displayed alignment marks (in FIGS. 14 and 15B they are indicated by the symbols A11, A12, A13, B12, B13, D11, D13, E13, etc.) for performing relative positional alignments of the images.

These alignment marks are projected onto the surface of exposure of the substrate 6 together with the respective divisional region images, and those alignment marks each consist of a prescribed image such as, for example, a mark shaped like a notation symbol "+" illustrated in FIG. 14, etc. Those alignment marks are in those states set to be the same in shape and in size.

On the other hand, the beams of light that form the respective divisional region images ("A", - - - , and "I") that are projected onto the surface of exposure of the substrate 6 are reflected by the surface of exposure of the substrate 6. They then enter into their respective corresponding prisms 11a, 11b, 11c, of the beam splitter 11 and are reflected by the interiors of those prisms 11a, 11b, 11c, - - - . They then are guided to their respective CCDs 12a, 12b, 12c, - - - of the imaging element 12 to thereby form the divisional region images corresponding to their receiving surfaces. The respective CCDs 12a, 12b, 12c, - - - perform prescribed photo-electric conversion processing, etc. with respect to those images that have been thus optically formed. And, the resulting images are converted to image data and are output to the data-processing device 8.

Upon receipt of the resulting data, the data-processing device 8 performs prescribed measurement processing on the projection data and reflects the result of its calculations in an image signal that is output to the image display device 4. Namely, the data-processing device 8 performs correction processing on the display image displayed in the image display device 4, too.

This correction processing is performed, for example, as follows.

FIG. 16 is a view illustrating the duplex regions each of that exists between the following two images. One is an image that is represented by the image data that is gotten by the CCD 12a of the imaging element 12 of the exposure device 1D of this embodiment. The other is an image that is represented by each of the adjacent CCDs and that is adjacent to that image.

As stated previously, in the exposure apparatus 1D of this embodiment, the circuit pattern based on the use of a given unit of circuit pattern data is displayed using the image display device 4. It is thereby arranged that the magnified circuit pattern image be projected on the surface of exposure of the substrate 6.

It is arranged that the circuit pattern image projected onto the substrate 6 in that way be re-imaged on the receiving surface of the imaging element 12 via the beam splitter 11. The image that is re-imaged on the receiving surface of the CCD 12a is as illustrated in FIG. 16.

On the CCD 12a there is imaged the divisional region image 12aa (in FIG. 16 the pattern image exhibited by the character "A") of the prescribed circuit pattern. In this divisional region image 12aa, there are included the alignment marks (refer to the symbols A21, A22, and A23 illustrated in FIG. 16) as stated previously. It is to be noted that the symbols B22 and B23 in FIG. 16 represent the alignment marks that are included in the divisional region image 12bb of the CCD 12b that is adjacent to the divisional region image 12aa of the CCD 12a. Also, the symbols D21 and D23 represent the alignment marks that are included in the divisional region image 12dd of the CCD 12d that is adjacent to the divisional region image 12aa of the CCD 12a. Further, the symbol E23 represents the alignment marks that are included in the divisional region image 12ee of the CCD 12e that is adjacent to the CCD 12a.

And, the respective alignment marks are disposed within the duplex region (the region indicated by the symbol D of FIG. 16) that is defined between the adjacent divisional region images. For example, the symbol E23 and the symbols A23, B23, and D23 are disposed at their prescribed positions within the duplex region at that the respective divisional region images 12aa, 12bb, 12dd, and 12ee of the CCDs 12a, 12b, 12d, and 12e are overlapped upon one another.

In this way, the prescribed alignment marks are disposed at prescribed positions of the respective divisional region images. And, the divisional region image including therein those alignment marks are subjected to photoelectric conversion processing through the operation of the imaging element 12 and thereby converted to data and transmitted to the data-processing device 8.

And, the data-processing device 8 not only performs divisional signal processing and other prescribed pieces of signal processing on the resulting data but also performs position correction processing based on the use of the image data that has been gotten by the imaging element 12, on that resulting data. The region data that has been prepared in this way is output to the respective liquid crystal display panels 4a, 4b, and 4c of the image display device 4. The region data that has thus been output thereto is projected onto the surface of exposure of the substrate 6. Accordingly, the image that is projected at this time is one that is already position correction processed so as to take a form wherein the mutually corresponding alignment marks have reliably overlapped each other within the duplex region between adjacent ones of the divisional region images.

It is to be noted that, in the exposure apparatus 1D of this embodiment, the above-described positional aligning operations of the respective divisional region images are performed in advance of actually performing the exposure operations with respect to the substrate 6.

As described above, the positional aligning operation of the respective divisional region images that is performed in the exposure apparatus 1D of this embodiment is performed by converting the circuit pattern image projected on the exposure surface of the substrate 6 to image data through the operation of the imaging element 12. Accordingly, the positional aligning operation is followed by the exposure operation that is performed with respect to the substrate 6. However, at the time of this positional aligning operation, it is of course preferable to prevent the substrate 6 from being actually exposed.

Figure 17:
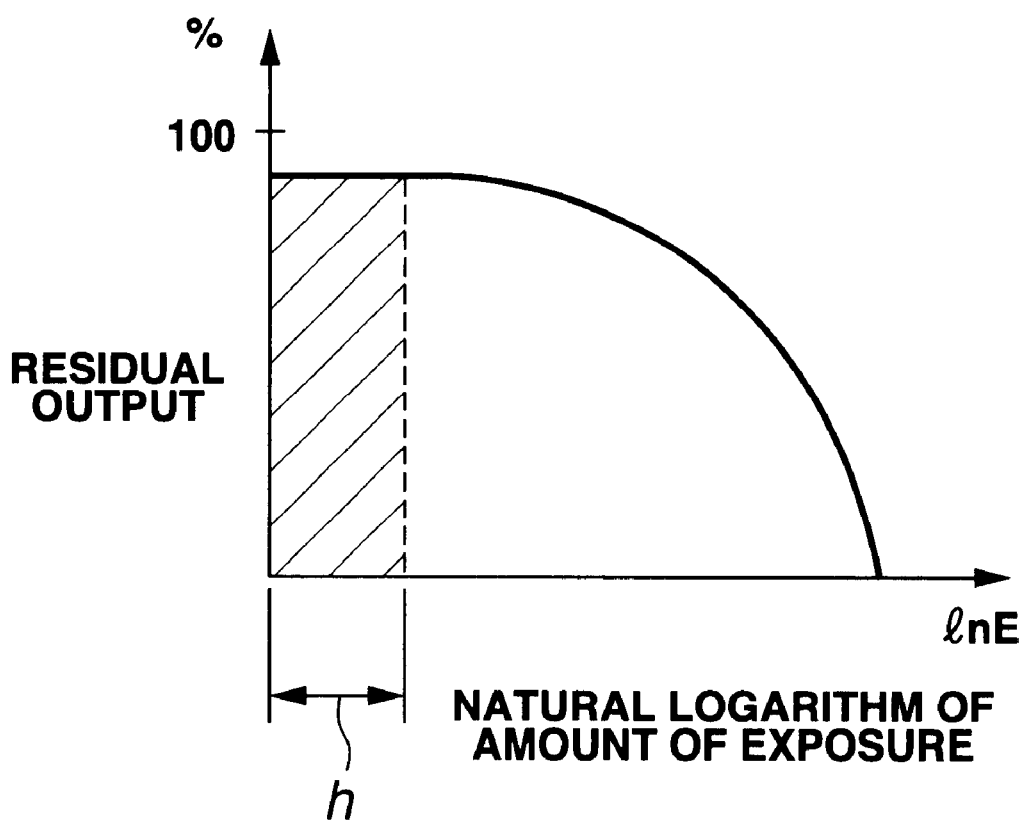
FIG. 17 is a view illustrating a characteristic curve of an ordinary photo-resist.

As stated previously, for example, a wafer, glass plate, etc. having a photo-resist coated thereon is used as the substrate 6. This photo-resist, in an ordinary case, has a characteristic such as that illustrated in FIG. 17 with respect to the natural logarithm. FIG. 17 is a view illustrating a characteristic curve of the photo-resist.

As illustrated in FIG. 17, the photo-resist has the characteristic that if the amount of exposure is within a prescribed range (the hatched portion indicated by the symbol h), the solubility thereof exhibits no decay. Accordingly, at the time of the exposure (also called "pre-exposure") that is performed beforehand for performing positional alignment, it is only needed to give an amount of exposure within a range not going beyond that prescribed amount h of exposure.

As has been explained above, according to the fifth embodiment having the above-described construction, the following effect can be obtained by providing the means for correcting relative positional alignment of the projection images that correspond to the respective divisional region images. Namely, it is possible to project the single unit of circuit pattern image, which is prepared based on the use of a desired unit of circuit pattern data, onto the prescribed substrate in a more faithful form.

Also, performing the positional alignment of the respective divisional region images is followed by pre-exposure. In this case, however, by aptly controlling the amount of exposure at the time of pre-exposure with the characteristic of the photo-resist being taken into consideration, it is possible to perform a more reliable positional aligning operation. In addition, nor is there the adverse effect upon the actual exposure operation (that is also called "the normal exposure").

In the above-described fifth embodiment, the alignment marks are included in the respective divisional region images. However, the same effect can be obtained even with use of an image recognizing technique for recognizing the configuration of the respective divisional region images, i.e. circuit pattern per se and without forming the alignment marks in particular.

Also, in the above-described fifth embodiment, the beam splitter 11 (the light beam splitting means) and the imaging element 12 (the image measurement means) are disposed prescribed space between the image display device 4 and the substrate 6. It is thereby arranged to get the image data for positional alignment from the reflected light beam of the image that has been projected on the substrate 6.

Separately from this, as the means for performing positional alignment of the respective divisional region images, means, which is shown next, can also be considered as being available therefor.

Figure 18:
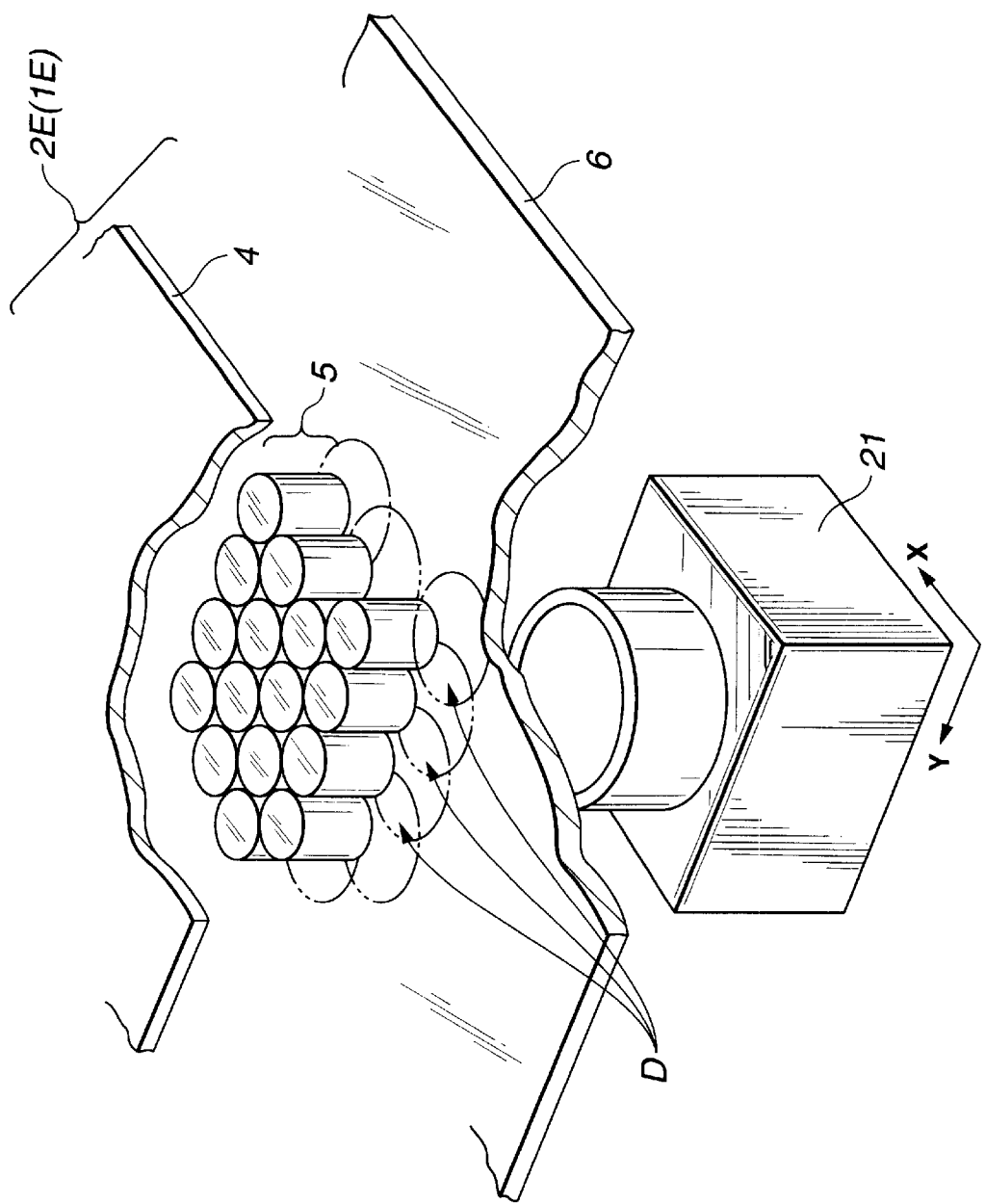
FIG. 18 is a main-part-enlarged perspective view illustrating the construction of a main part of the exposure apparatus according to a sixth embodiment of the invention.

FIG. 18 is an enlarged perspective view illustrating the construction of a main part of the exposure apparatus according to a sixth embodiment of the present invention. It is to be noted that, in FIG. 18, for brevity of the illustration, the exposure apparatus and the object to be worked (substrate) with respect to that exposure is performed by this exposure apparatus are respectively illustrated by being partly broken away.

The basic construction of the exposure apparatus 1E of this embodiment is substantially the same as that of the above-described first embodiment. But as shown in FIG. 18, that construction differs from the latter construction in that at a prescribed position on a side that is opposite to that where the exposure means 2E is disposed with the substrate 6 being placed therebetween there is disposed the imaging device 21 that if is the image measurement means comprised of the imaging element.

In this imaging device 21, it is set that only part of the divisional region images alone, which is taken with respect to the whole range of the circuit pattern projected onto the substrate 6, can be imaged by the imaging operation that is performed once. And, this imaging device 21 is disposed in such a way as to be freely movable in the arrow X indicated direction and arrow Y indicated direction of FIG. 18. In this imaging device 21, it is thereby arranged that the image data over the whole range of the circuit pattern image can be gotten while the device 21 is continuously performing its imaging operation while being moved. The other construction is the same as that of the first embodiment.

In the exposure apparatus 1E of this embodiment having the above-described construction, as in the above-described fifth embodiment, it is arranged for the pre-exposure operation to be performed in advance of the performance of the actual exposure operation. In this case, the single unit of circuit pattern image that is displayed by the image display device 4 is projected, by being magnified, onto the exposure surface of the substrate 6 by the magnifying projection optical system 5. The substrate 6 is one that consists of a glass plate or the like. Therefore, the projection image that is formed on the substrate 6 is transmitted through the substrate 6, and is imaged by the imaging device 21 that is disposed on a reverse surface side (the lower part in FIG. 18) of the substrate 6.

Namely, in the imaging device 21, it is arranged to receive the circuit pattern image (optical image) that is formed on the substrate 6 and thereby to perform photoelectric conversion with respect thereto. It is thereby arranged to output the resulting image data to the data-processing device (no illustration thereof is made in FIG. 18. See the symbol 8 in FIG. 15A) as a prescribed format of image data. And, in the data-processing device 8, various kinds of pieces of signal processing including position correction processing are performed with respect to that image data. These pieces of signal processing are the same as those which are performed in the above-described fifth embodiment.

As described above, according to the sixth embodiment as well, the same advantage as is obtainable with the fifth embodiment can be obtained. Further, in this embodiment, compared to the above-described fifth embodiment, it is possible to omit the constituent members such as the beam splitter 11 serving as the light beam splitter means, etc. Therefore, it is possible to realize the same effect with a simple construction.

On the other hand, separately from the means for correcting positional displacement according to the projection image (the circuit pattern or the alignment marks included therein) that is projected onto the substrate as in the case of the above-described fifth and sixth embodiments, it is also considered as being effective to perform correction of the positional displacement of the circuit pattern to be exposed by the means that is illustrated as follows.

The LCD that is manufactured using the exposure apparatus, etc. each are generally of a type wherein various kinds of circuit patterns are formed over a plurality of layers. Accordingly, at the time of the manufacture, the exposure operation is repeatedly performed for each layer. In this case, correcting the positional displacement of the image at the time of the next exposure operation, for example, by utilizing the circuit pattern or alignment marks that are prepared on the exposure surface of the substrate 6 in a preceding process step is possible.

Figure 19:
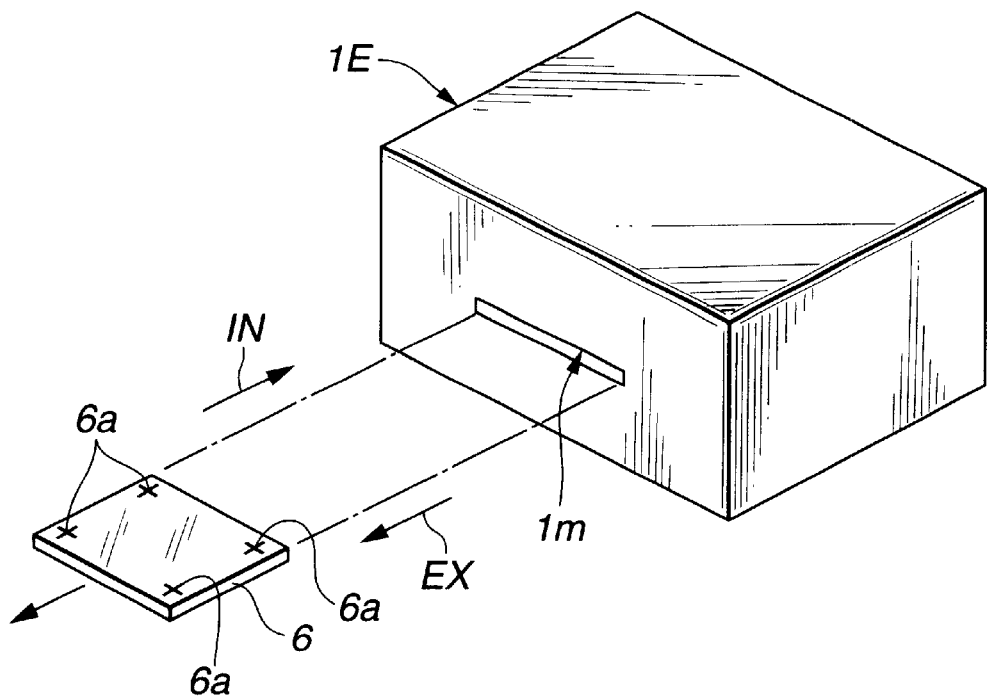
FIG. 19 is a conceptual view illustrating the exposure apparatus as a whole according to a seventh embodiment of the invention.
Figure 20:
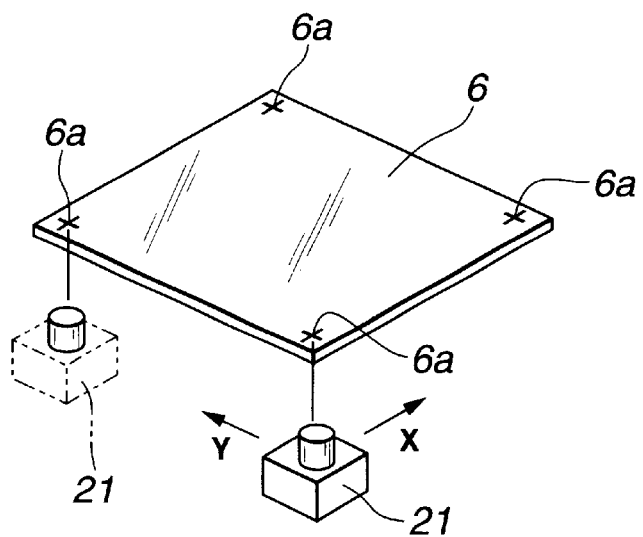
FIG. 20 is a view illustrating the positional relationship between image measurement means (imaging device) in the exposure apparatus of FIG. 19 and the substrate with respect to that exposure is performed by the exposure apparatus.

FIGS. 19 and 20 are conceptual views each illustrating the exposure apparatus according to a seventh embodiment of the invention. FIG. 19 illustrates the exposure apparatus as a whole. FIG. 20 illustrates the positional relationship between the image measurement means (imaging device) of the exposure apparatus of this embodiment and the substrate with respect to that exposure is performed using that exposure apparatus.

The basic construction of the exposure apparatus of this embodiment is the same in construction as the above-described sixth embodiment. Therefore, a detailed explanation of the respective kinds of constituent members that constitute the exposure apparatus is omitted.

As illustrated in FIG. 19, the exposure apparatus 1E of this embodiment has provided at a prescribed position of its externally covering part a substrate insertion/removal opening 1m so as to enable the desired substrate 6 wanted to be manufactured to be disposed to a prescribed position of the interior thereof and taken out from this prescribed position.

The substrate 6 is subjected to the exposure processing that is performed a plurality of times in the process of manufacturing the substrate 6. However, in this case, it sometimes happens that pieces of processing that are separate from the exposure processing, such as cleaning processing or thermal treatment, are performed. These separate pieces of processing are performed using, for example, the apparatus that is different from the exposure apparatus 1E. With this being taken into consideration, the substrate 6 that is in the course of the processing is made freely removably insertable with respect to the exposure apparatus 1E.

The operation that is performed in that case is as follows. Namely, first, the substrate 6 is installed to within the exposure apparatus 1E, thereby prescribed exposure processing is performed. Thereafter, in order to perform separate processing such as cleaning processing with respect to the substrate 6 that has already been processed until midway, the substrate 6 is taken out from the exposure apparatus 1E. The arrow mark EX in FIG. 19 indicates that the substrate 6 can be taken out from the exposure apparatus 1E.

Subsequently, the substrate 6 is subjected to prescribed separate pieces of processing (cleaning, heating, etc.) with the use of the separate apparatus or the like (not illustrated). Thereafter, that substrate 6 is installed to a prescribed position of the interior of the exposure apparatus 1E again and is subjected to the next exposure processing. The arrow mark IN in FIG. 19 indicates that the substrate 6 can be mounted to the exposure apparatus 1E.

In a case of performing exposure processing a plurality of times with respect to the substrate 6 in that way and in case performing the second and thereafter-succeeding exposure processings with respect thereto, especially if having de-mounted and re-mounted the substrate 6 with respect to the exposure apparatus 1E in order to perform separate pieces of processing, the following measures should be taken. Namely, before performing the second and thereafter-succeeding exposure processings, it is needed to positionally align the circuit pattern image to be exposed next and the circuit pattern that was already exposed in the immediately preceding exposure processing with each other.

As illustrated in FIG. 20, in the exposure apparatus 1E of this embodiment, it is arranged that, for example, when performing preceding exposure processing, the alignment marks 6a be formed at prescribed positions that are located on the exposure surface of the substrate 6. And, when performing the next exposure processing, the pre-exposure operation is performed in advance thereof. It is thereby arranged to perform positional alignment of the projection image according to those alignment marks 6a.

The procedure of performing positional alignment in this case is performed in completely the same way as in the above-described sixth embodiment. That is, in the interior of the exposure apparatus 1E, at a position that opposes the exposure means 2 and that is on a side that is opposite to the side of the exposure means 2 with the intervention of the substrate 6 between these two sides, the imaging device 21 is sequentially moved according to a prescribed procedure in the arrow X direction and arrow Y direction of FIG. 20. While these sequential movements are being performed, the exposure apparatus 1E gets image data of the projection image (circuit pattern image) of the substrate 6. This image data is transmitted to the data-processing device 8 where various kinds of pieces of signal processing including position correction processing are performed.

As has been explained above, according to the seventh embodiment, in the process steps of manufacture, the exposure operation is performed a plurality of times. Simultaneously, even when the substrate 6 is de-mounted from and re-mounted into the exposure apparatus 1E and thereby separately processed, the exposure processing of the circuit pattern image can reliably be executed with respect to a prescribed position of the substrate 6.

In this embodiment, an explanation has been given by taking up the exposure apparatus 1E of the sixth embodiment as an example. However, the position correction (measurement) means of this embodiment can also be easily applied to the exposure device of each of the other embodiments such as that the exposure device 1D of the above-described fifth embodiment similarly as well.

In the above-described fifth embodiment, there is controlled the amount of illumination light, i.e. amount of exposure light that is used when pre-exposure is performed for the positional alignment of the projection images that are projected onto the substrate 6. By performing this control of the amount of exposure light, it is arranged to enable forming the projection images the respective positions of that can be aligned with one another and also to cause the amount of exposure light to become equal to or smaller than a prescribed range of amount of exposure light that has no bad effect upon the normal or regular exposure. Namely, in the above-described fifth embodiment, it was arranged to perform the positional alignment of the projection images taking the characteristic (see FIG. 17) of the photo-resist into consideration.

Putting this aside, as the means for performing the positional alignment of the projection images through the performance of the pre-exposure operation, means, which is shown next, is also considered as being available.

Figure 21:
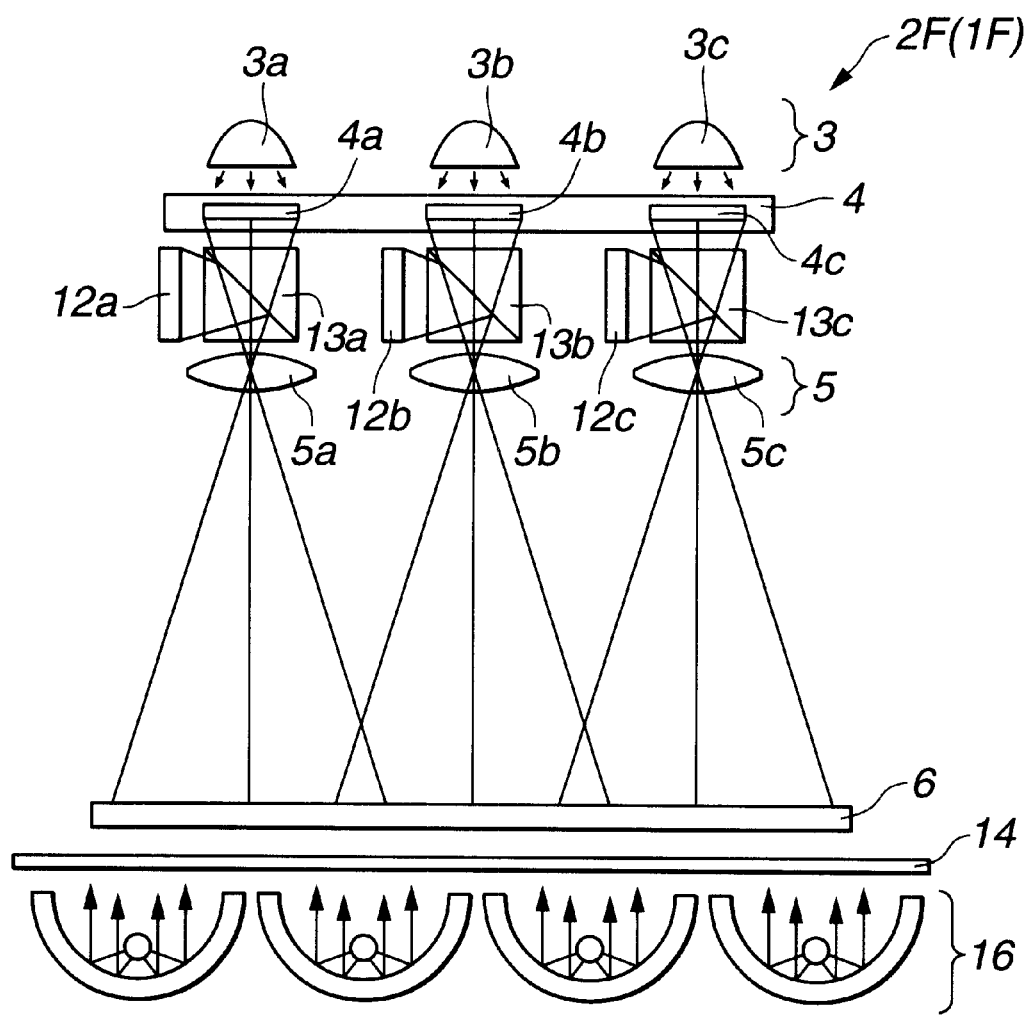
FIG. 21 is a main-part construction view illustrating a main part of the exposure apparatus according to an eighth embodiment of the invention.

FIG. 21 is a construction view illustrating a main part of the exposure apparatus according to an eighth embodiment of the present invention. The basic construction of the exposure device 1F of this embodiment is substantially the same as that of the above-described fifth embodiment (see FIG. 14). Also, in the exposure apparatus of this embodiment, it is arranged that, as in the above-described sixth embodiment (see FIG. 18), correction processing be performed for performing positional alignment according to the circuit pattern or alignment marks that were formed in the performance of the immediately preceding exposure processing.

Namely, the exposure means 2F of the exposure apparatus 1F of this embodiment differs from the fifth embodiment in that that exposure means 2F does not use the beam splitter 11 that is the light beam splitter means of the exposure apparatus 1D of the fifth embodiment. Instead, the exposure means 2F has disposed therein a plurality of dichroic prisms 13a, 13b, and 13c each of that has an optical characteristic enabling the transmission or reflection of the light beam whose wavelength is within a specified region.

Also, as a result of this, at a prescribed position on a side that is opposite to the side wherein the exposure means 2F is disposed, with the substrate 6 existing between the two sides, there is disposed the measuring illumination device 16. The light that is emitted from this measuring illumination device 16 is illuminated onto the substrate 6 via an orange-colored color filter 14.

Here, in case the photo-resist used on the substrate 6 has a characteristic of being sensitive to the beam of light whose wavelength falls within a specified region, e.g. the beam of G-ray light (the wavelength=436 nm (nano-meters)) and of being not sensitive to the beam of light whose wavelength falls within a region different from that specified region, e.g. the beam of light whose wavelength is in the range of orange color light (the wavelength=600 nm), the dichroic prisms 13a, 13b, and 13c each are formed so as to have a characteristic of transmitting the beam of G-ray light and reflecting the beam of light whose wavelength is in the range of orange color light.

Also, while the illumination device 3 is one for illuminating the image display device 4 when the exposure operation of the circuit pattern image is performed with respect to the substrate 6, the beam of illumination light of that illumination device 3 contains a light of G rays. On the other hand, the beam of illumination light from the measuring illumination device 16, as described above, transmits the orange-colored color filter 14, thereby the light beam of orange color components illuminates the substrate 6.

Accordingly, when performing the positional alignment of the projection images in advance of the actual performance of the exposure operation, first, using the measuring illumination device 16 illumination is performed of the substrate 6 from a reverse surface side (the lower side in. FIG. 21) thereof. Then, because the circuit pattern that is already formed on the exposure surface of the substrate 6 through the preceding exposure processing has the color components through the function of the color filter 14, that circuit pattern is reflected by the dichroic prisms 13a, 13b, and 13c. This circuit pattern then is guided to the CCDs 12a, 12b, and 12c, and thereby the circuit pattern images are formed on their respective light receiving surfaces thereof. Upon receipt thereof, the CCDs 12a, 12b, and 12c perform their respective pieces of photoelectric conversion processing, etc. to thereby get a prescribed format of image data. Then, this image data is transmitted to the data-processing device (no illustration thereof is made in FIG. 21. See the symbol 8 of FIG. 15A) where various kinds of pieces of signal processing including the position correction processing are performed with respect thereto. The image with respect to that position correction processing for positional alignment has been done in that way is displayed in the liquid crystal display panels 4a, 4b, and 4c of the image display device 4, whereby a state where the actual exposure operation can be performed results.

Thereafter, the measuring illumination device 16 is changed over to the exposure illumination device 3, thereby the radiation of illumination light by this illumination device 3 starts to be performed. Namely, the illumination light beam (containing therein G-ray light) from the illumination device 3 is radiated onto the display images of the respective liquid crystal display panels 4a, 4b, and 4c of the image display device 4. Then, the illumination light forming the circuit pattern image according to those display images is transmitted through the dichroic prisms 13a, 13b, and 13c and then through the respective lenses 5a, 5b, and 5c of the magnifying projection optical system 5 to reach the exposure surface of the substrate 6. That illumination light thereby projects the magnified circuit pattern image there so that this light may provide a prescribed amount of exposure for a prescribed length of time. In this way, the exposure operation is performed.

As explained above, according to the above-described eighth embodiment, separately from the exposure illumination device 3, the measuring illumination device 16 is provided. It is thereby arranged to perform the pre-exposure processing for positional alignment by the use of the light beam that has a wavelength region different from the wavelength region at the time of the regular exposure operation and that is unable to expose the substrate 6. Therefore, the pre-exposure operation has no adverse effect upon the substrate 6. Therefore, the exposure processing that is always reliable can be performed.

Next, the exposure apparatus according to a ninth embodiment of the present invention will hereafter be explained.

Figure 22:
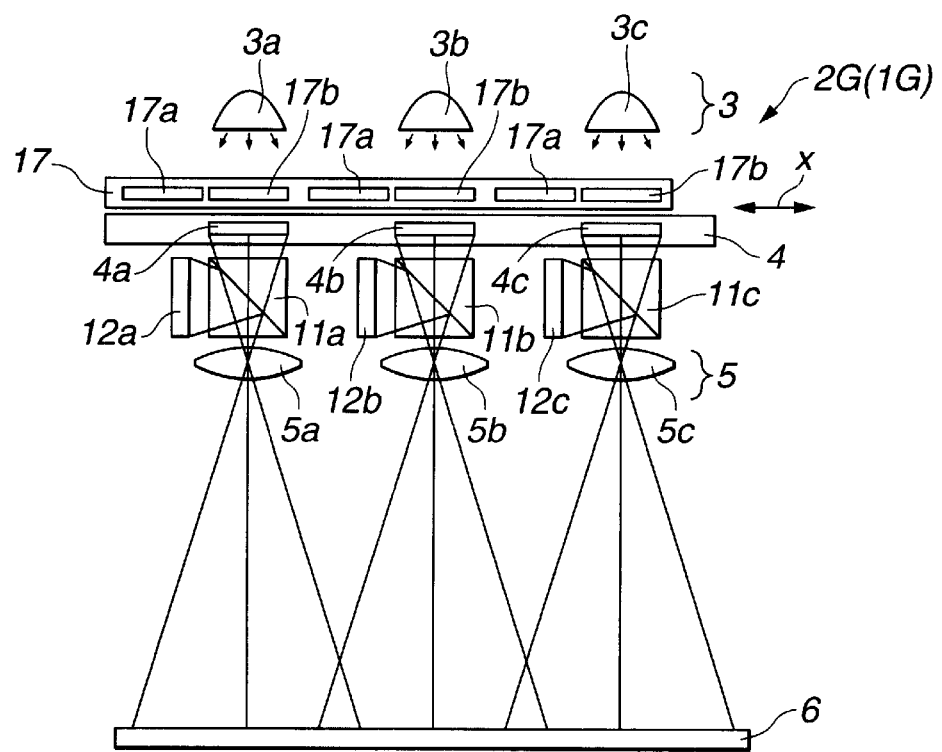
FIG. 22 is a main-part construction view illustrating a main part of the exposure apparatus according to a ninth embodiment of the invention.

FIG. 22 is a main-part construction view illustrating a main part of the exposure apparatus of this embodiment. The basic construction of the exposure apparatus 1G of this embodiment is also substantially the same as that of the fifth embodiment (see FIG. 14). Also, in the exposure apparatus of this embodiment, unlike the eighth embodiment (see FIG. 21), it is arranged, as in the case of the fifth embodiment, to perform correction processing for positional alignment according to the alignment marks projected along with the images or to the circuit pattern image per se.

Namely, the exposure means 2G of the exposure apparatus 1G of this embodiment is characterized by having disposed therein, in addition to completely the same construction as that of the exposure device 1D of the fifth embodiment, a wavelength changeover filter 17 that is comprised of two kinds of color filters 17a and 17b each capable of transmitting a light beam whose wavelength is within a specified region.

One color filter 17a constituting the wavelength changeover filter 17 has an optical characteristic of permitting the transmission therethrough of a light beam whose wavelength is within a specified region, e.g., a light beam such as a G-ray light beam (the wavelength=436 nm). The other color filter 17b has an optical characteristic of permitting the transmission therethrough of a light beam whose wavelength is different from that of that specified region, e.g., a light beam such as that whose wavelength is within a wavelength region (the wavelength=600 nm) of orange color light.

And, the wavelength changeover filter 17 is disposed so as to be freely slidable in the arrow X direction of FIG. 22. When positional displacement correction processing is performed, as illustrated in FIG. 22 said other color filters 17b are so set as to be disposed at their prescribed positions that oppose their respective illuminators 3a, 3b, and 3c of the illumination device 3 and their respective liquid crystal display panels 4a, 4b, and 4c of the image display device 4. FIG. 22 illustrates this state.

In this case, the illumination lights from the respective illuminators 3a, 3b, and 3c are radiated onto the display surface of the respective liquid crystal display panels 4a, 4b, and 4c by being passed through the color filters 17b only in terms of the orange color light beam. Accordingly, the projection image that is formed on the exposure surface of the substrate 6 does not make the photo-resist of the substrate 6 sensitive to that light beam.

The projection image that has been projected onto the exposure surface of the substrate 6 is re-imaged onto the light receiving surfaces of the respective CCDs 12a, 12b, and 12c of the imaging element 12 via the beam splitter 11 comprised of the prisms 11a, 11b, and 11c. As a result of this, the respective CCDs 12a, 12b, and 12c perform prescribed photoelectric conversion processing, etc. with respect to the resulting image to thereby get image data of the projection image. Then, the image data is transmitted to the data-processing device (no illustration thereof is made in FIG. 22. See the symbol 8 of FIG. 15A), whereby various kinds of pieces of signal processing including position correction processing are performed. The image with respect to that position correction processing for positional alignment has been performed is displayed in the liquid crystal display panels 4a, 4b, and 4c, thereby a state where the actual exposure operation can be performed results.

When a state where the exposure operation can be performed is arrived at, the wavelength changeover filter 17 is set to a state at the time of the exposure operation. Namely, the filter 17 is set to a state where one color filters 17a have been disposed at prescribed positions that oppose their respective illuminators 3a, 3b, and 3c and their respective liquid crystal display panels 4a, 4b, and 4c. Resultantly, the illumination lights from the respective illuminators 3a, 3b, and 3c are radiated onto the display surface of the liquid crystal display panels 4a, 4b, and 4c by being passed through the color filter 17a only in terms of the G-ray light alone. Accordingly, the projection image that is formed on the exposure surface of the substrate 6 makes the photo-resist of the substrate 6 sensitive to those lights, thereby prescribed exposure is performed.

In this way, the exposure apparatus 1G of this embodiment makes one color filter 17a have the optical characteristic of permitting the transmission of light beam whose wavelength is within a region contributing to performing the exposure operation and makes the other color filter 17b have the optical characteristic of permitting the transmission of light beam whose wavelength is within a region not contributing to performing the exposure operation. By changing over one of these color filters 17a and 17b to the other, it is arranged to change over the characteristic of the illumination light of single unit the illumination device 3 as a whole.

As has been explained above, according to the above-described ninth embodiment, with a simpler construction, it has been arranged that, both at the time of the pre-exposure operation for performing positional correction processing and at the time of the actual exposure operation, the projection images that result from the light beams the regions of whose wavelengths are different from each other are projected onto the exposure surface of the substrate 6. Therefore, even when radiating the illumination light with respect to the substrate 6 at the time of the pre-exposure operation, it does not happen that the photo-resist becomes sensitive to the light beam. Accordingly, the pre-exposure operation has no adverse effect upon the substrate 6 and can therefore execute position correction processing according to the projection image.

Next, the exposure apparatus according to a tenth embodiment of the present invention will hereafter be explained.

Figure 23:
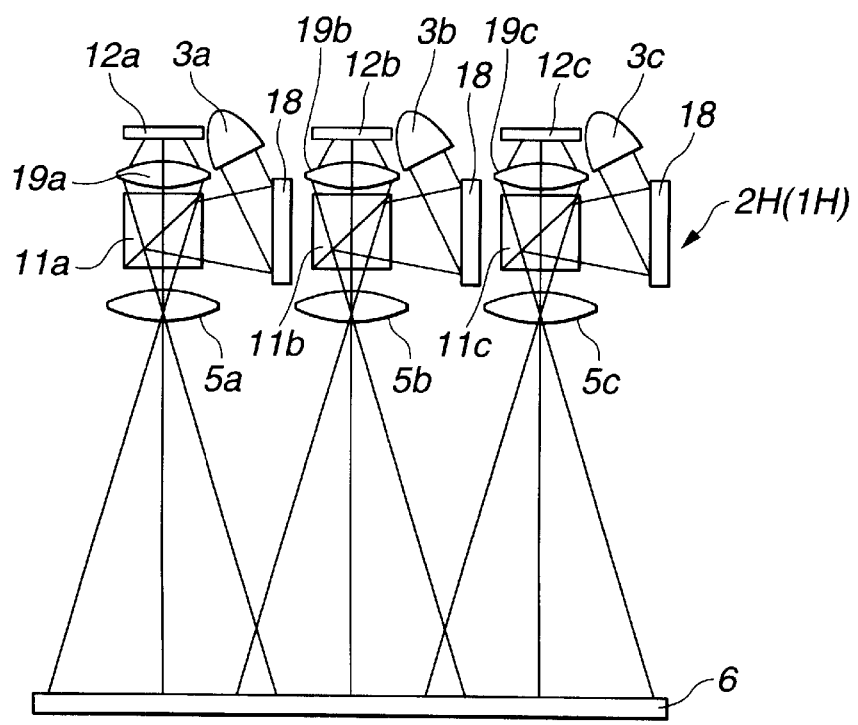
FIG. 23 is a main-part construction view illustrating a main part of the exposure apparatus according to a tenth embodiment of the invention.

FIG. 23 is a main-part construction view illustrating a main part of the exposure apparatus of this embodiment. In this embodiment as well, the basic construction thereof is substantially the same as that of the above-described fifth embodiment. This embodiment, however, differs from the fifth embodiment in that, in the exposure apparatus 1H of this embodiment, the exposure means 2E is constructed using a DMD (Digital Micro-mirror Device) 18 as the display device constituting the image display means.

In general, in order to aptly reproduce the circuit pattern of the original image on the exposure surface of the substrate 6 that is an object to be worked, it is necessary to accurately display the amplitude information and phase information of the Fourier transform processed image by the image display device. To realize this, in this embodiment, the DMD 18 is used as the display device.

The DMD 18 has the function of displaying the image as in the case of the respective liquid crystal display panels 4a, 4b, and 4c of the image display device 4 in each of the respective embodiments. For that reason, in each DMD 18, a plurality of fine (e.g., ten-odd μm (microns) square or so of) mirror members are disposed being two-dimensionally arrayed, thereby a display surface capable of displaying, for example, a ten-odd mm (millimeters) square of image is formed. And, each of this plurality of mirror members is independently controlled so that the angle of inclination thereof with respect to the display surface and the displacement in the direction perpendicular to the array surface thereof may be individually altered utilizing, for example, the force of the static electricity.

Accordingly, when having the light beam onto the display surface of the DMD 18, it is arranged that if controlling the angle of inclination and the displacement in the direction perpendicular to the array surface of the prescribed mirror members of the DMD 18 the optical path of the reflected light beam of the illumination light be able to be controlled.

And, it is possible to modulate the intensity (amplitude) of the reflected light beam by changing the angle of the mirror member and to modulate the phase of the reflected light beam by displacing the mirror in the direction perpendicular to the array surface. It is thereby possible to display as two-dimensional array the amplitude information and phase information of the Fourier transform processed image that is formed as a result of that.

This DMD 18 is disposed so as to oppose the side surface of each of the respective prisms 11a, 11b, and 11c of the beam splitter 11 and simultaneously so that the display surface may become substantially parallel with the optical axis of each of the respective lenses 5a, 5b, and 5c of the magnifying projection optical system 5. And, each of the respective illuminators 3a, 3b, and 3c of the illumination device 3 for illuminating the display surface of the DMD 18 is disposed at a prescribed position that enables the illumination light beam emitted from each of those illuminators 3a, 3b, and 3c to be incident upon the display surface of the DMD 18 at a prescribed angle of incidence.

Also, on the upper-surface sides of the respective prisms 11a, 11b, and 11c of the beam splitter 11, the CCDs 12a, 12b, and 12c of the imaging element 12 used to get the image data for performing position correction processing, and the optical lenses 19a, 19b, and 19c for imaging prescribed images onto the light receiving surfaces of the respective CCDS 12a, 12b, and 12c, are respectively disposed.

The operation of the DMD 18 of the exposure apparatus 1H of this embodiment will hereafter be explained.

Figure 24:
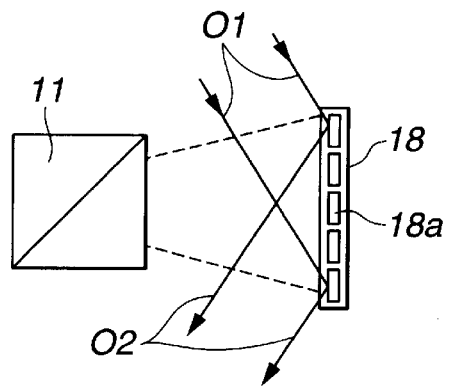
FIG. 24 illustrates only a DMD (image display means) and beam splitter alone, taken out, that are used in the exposure apparatus of FIG. 23, and illustrates a state where the DMD is kept non-driven.
Figure 25:
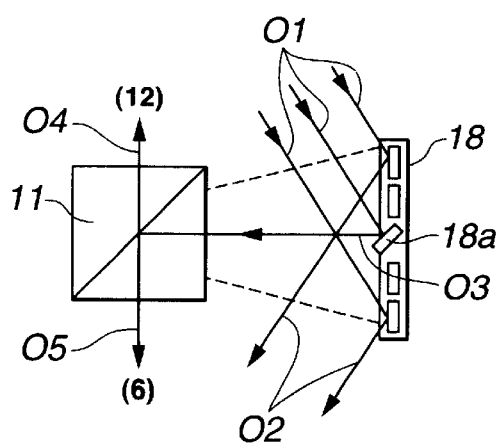
FIG. 25 illustrates only the DMD (image display means) and beam splitter alone, taken out, that are used in the exposure apparatus of FIG. 23, and illustrates a state where the DMD is kept driven.

FIGS. 24 and 25 are views each illustrating only the DMD (image display means) and beam splitter alone, that have been taken out from among the constituent members used in the exposure apparatus of this embodiment. FIG. 24 illustrates a state where the DMD is not being driven and FIG. 25 illustrates a state where the DMD is being driven.

When the DMD 18 is in a non-driven state, as illustrated in FIG. 24 the display surface of each of the respective mirror members forming the display surface of the DMD 18 is so set as to become substantially parallel with the DMD 18. In this state, the illumination light beam O1 of the illumination device 3 (no illustration thereof is made in FIG. 24) enters into the display surface of the DMD 18 at a prescribed angle of incidence and then is reflected along an optical path indicated by the symbol O2. This reflected light beam O2 is so set as not to enter into the beam splitter 11. As a result of this, the light beam forming the display image of the DMD 18 is guided to neither the side of the substrate 6 nor the side of the imaging element 12.

On the other hand, when driving the DMD 18, the state illustrated in FIG. 25 results. Namely, the DMD 18 is drive-controlled by prescribed control means (not illustrated). Thereby, a given mirror member 18a of the mirror members that form the display surface of the DMD 18 is rotated so as to have a prescribed angle of inclination with respect to the display surface of the DMD 18. Then, only the reflected light beam O3 that is reflected by the mirror member 18a that has been driven, of the illumination light beams O1 emitted from the illumination device 3, is guided to the side of the beam splitter 1.

In this way, the rotation of the mirror member can make the light "on" and "off" (the intensity modulation of the light). Further, displacing the mirror member 18a to the direction perpendicular to the surface of array thereof can modulate the phase of the light beam that is reflected.

And, the light beam O3 is guided as the light beam O5 to the side of the substrate 6 through the function of the beam splitter 11. Also, the light beam O5 that has been reflected by the substrate 6 is transmitted through the beam splitter 11 to enter into the imaging element 12 as the light beam O4. Resultantly, at the corresponding position of the light receiving surface of the imaging element 12, and at the corresponding position of the exposure surface of the substrate 6, to the light beam, a prescribed image, i.e., the display image at the mirror member 18a of the DMD 18, is projected.

Also, in this state, the reflected light beam O2 that is reflected by other mirror members than the mirror member 18a is in a state of being kept out of entry into the beam splitter 11 as in the non-driven state of the DMD 18 as illustrated in FIG. 25. Accordingly, with respect to the corresponding regions at the light-receiving surface of the imaging element 12 and at the exposure surface of the substrate 6, no image whatsoever is kept projected.

In this way, in the state of the DMD 18 being driven (see FIG. 25), among a plurality of the mirror members, a desired mirror member is drive-controlled according to the necessity. As a result of this, among the light beams forming the display image that is to be displayed on the DMD 18, only the desired light beam alone is guided to the side of the beam splitter 11. It is thereby possible to project the desired image with respect to the light-receiving surface of the imaging element 12 and also to the exposure surface of the substrate 6.

The circuit pattern image to be projected is represented by the distribution of the light intensity. In this case, however, it often happens that the phase information is completely lost. Therefore, calculating the amplitude information and phase information of the Fourier transform processed image that is to be displayed by the DMD (display device) 18 for projecting the desired image onto the exposure surface of the substrate 6 (the object to be worked) according to the image data of the projected circuit pattern image is followed by the performance of a very large amount of very complex operation processing.

On that account, in this embodiment, without executing such a complex, and a large amount of, operation process, the amplitude information and phase information of the Fourier transform processed image that is to be displayed by the DMD 18 are calculated through the operation of the means that is shown as follows.

Namely, first, there are measured the intensities of the circuit pattern image that is projected onto the exposure surface of the substrate 6 and there are taken the intensity distribution. Then, there are determined the square roots of those intensities and, according thereto, the amplitudes, and then the amplitude distribution, are calculated. Subsequently, assuming that spherical waves be emitted from the prescribed respective points of that circuit pattern image, it is assumed that these spherical waves be composed on the display surface of the DMD 18. In this case, the data of the image formed by the DMD 18 is produced. Specifically, the equation of optical path integration is executed with respect to every one of a prescribed number (M number) of points of the DMD 18. Thereby, the complex conjugate of the composite pattern of the DMD 18 is determined.

In accordance with the above-described procedure, it is possible to greatly reduce the amount of calculation.

As has been explained above, according to the tenth embodiment, because the DMD 18 is used as the image display means, more easily, the desired display image can be arbitrarily projected with respect to the light-receiving surface of the imaging element 12 and to the exposure surface of the substrate 6. Accordingly, the image data for performing position correction processing of the image can be obtained with a higher accuracy and with a higher reliability.

Also, without a limitation being imposed by the spatial resolution characteristic of the DMD (display device) 18, the circuit pattern image that is highly accurate and high in resolution can be easily projected onto the exposure surface of the substrate (the object to be worked) 6.

Next, the exposure apparatus according to an eleventh embodiment of the present invention will hereafter be explained.

Figure 26:
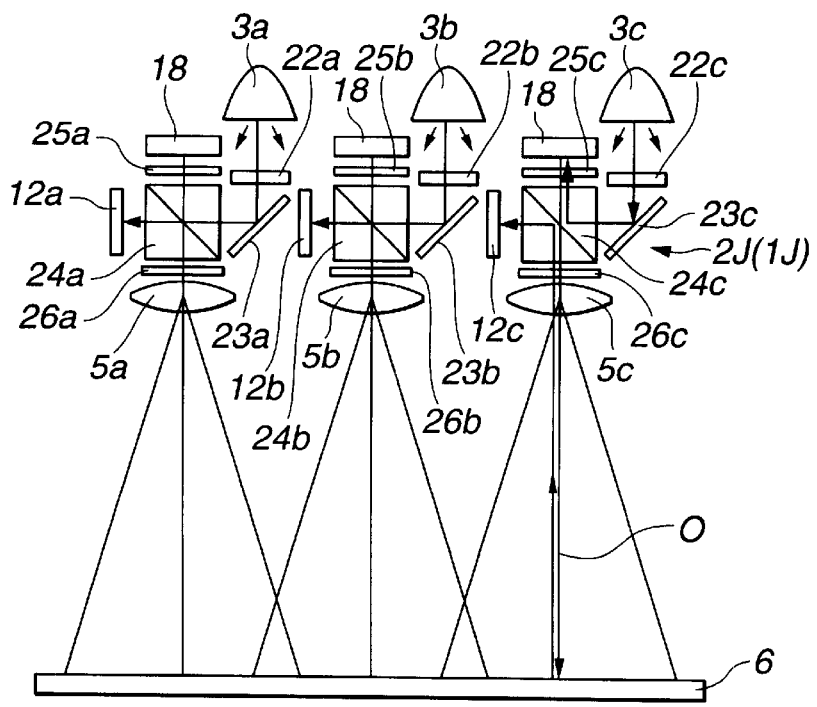
FIG. 26 is a main-part construction view illustrating a main part of the exposure apparatus according to an eleventh embodiment of the invention.

FIG. 26 is a main-part construction view illustrating a main part of the exposure apparatus of this embodiment. The construction of this embodiment is basically substantially the same as that of the above-described tenth embodiment. But this embodiment differs from the latter embodiment in that, in the exposure apparatus 1J of this embodiment, it is constructed to distribute out the light beam directed to the image display means (DMD) and to the light beam to the side of the imaging element (CCD) through the utilization of the polarization of light.

Namely, the exposure apparatus 1J of this embodiment comprises a plurality of the illuminators 3a, 3b, and 3c constituting the illumination device 3, reflection mirrors 23a, 23b, and 23c that reflect the respective illumination lights from the illuminators 3a, 3b, and 3c and that guide these reflected light beams to a prescribed direction, polarizing plates 22a, 22b, and 22c that are respectively disposed in the spaces between the illuminators 3a, 3b, and 3c and their corresponding reflection mirrors 23a, 23b, and 23c to thereby make their prescribed polarization, polarized-beam splitters 24a, 24b, and 24c that are located on the optical path of the light beams reflected by the reflection mirrors 23a, 23b, and 23c and that thereby are light beam splitter means upon that those light beams enter, first $\lambda/4$ plates ($\lambda$ (lambda) the fourth plate) 25a, 25b, and 25c and second $\lambda/4$ plates ($\lambda$ (lambda) the fourth plate) 26a, 26b, and 26c that are located on the optical paths of the polarized light and that thereby transmit this polarized light therethrough to alter the deflection angle thereof, the DMDs 18 that are the image display means for respectively displaying the images representing the divisional region images of the circuit pattern including the alignment marks, a plurality of the lenses 5a, 5b, and 5c constituting the magnifying projection optical system 5, and a plurality of the CCDs 12a, 12b, and 12c constituting the imaging element 12.

The reflection mirrors 23a, 23b, and 23c are located in the vicinity of the polarized beam splitters 24a, 24b, and 24c. And they are disposed being inclined substantially at a 45 degrees angle with respect to the optical path of the illumination light beam from the illumination device 3. And, in addition, the reflection surfaces thereof are set so as to face the illumination device 3 and the polarized beam splitters 24a, 24b, and 24c. Thereby, the illumination light beams from the illumination device 3 are reflected and are guided to the polarized light beam splitters 24a, 24b, and 24c.

The polarized beam splitters 24a, 24b, and 24c are each so constructed as to have a characteristic of their being capable of reflecting a prescribed polarized light. And, the polarizing plates 22a, 22b, and 22c are each so set as to produce a polarized light that has a characteristic of its being capable of being reflected by the reflection surface that is provided within the polarized beam splitter 24a, 24b, or 24c.

In the exposure means 2J of this embodiment that has been constructed as stated above, the illumination light beam that is radiated from the illumination device 3 goes along the optical path indicated by the arrow mark O in FIG. 26 to reach the light-receiving surface of the imaging element 12 as well as to reach the exposure surface of the substrate 6.

That is, the illumination light beam that is radiated from the illumination device 3 first is transmitted through the polarizing plates 22a, 22b, and 22c, thereby polarized light is formed. Thereafter, the polarized light is reflected by a corresponding one of the reflection mirrors 23a, 23b, and 23c and is guided to the side of the polarized beam splitter 24a, 24b, and 24c.

The polarized light that has entered upon the polarized beam splitter 24a, 24b, 24c is reflected by the reflection surface within the polarized beam splitter 24a, 24b, 24c. Thereby, the polarized light is guided to the side of the DMD 18 that is located upper in FIG. 26. Then, the resulting light beam is transmitted through the first $\lambda/4$ plate 25a, 25b, 25c, and then radiates the display surface of the DMD 18 and is reflected by this display surface. Then, the resulting light beam goes downward in FIG. 26 and then is transmitted through the first $\lambda/4$ plate 25a, 25b, 25c once again and then is guided to the polarized beam splitter 24a, 24b, 24c. Here, because the polarized light is transmitted twice through the first $\lambda/4$ plate 25a, 25b, 25c, the vibration direction of the vibration vector is rotated through a 90 degrees angle. Accordingly, that polarized light is transmitted through the polarized beam splitter 24a, 24b, 24c.

The light beam that has been transmitted through the polarized beam splitter 24a, 24b, 24c advances toward the side of the substrate 6 via the second $\lambda/4$ plate 26a, 26b, 26c and magnifying projection optical system. As a result of this, on the exposure surface of the substrate 6 there is projected the magnified prescribed circuit pattern image. In this state, the exposure operation can be done.

At this time, the light beam that has been reflected by the substrate 6 advances upward in FIG. 26 and is once again transmitted through the second λ/4 plate 26a, 26b, 26c and then enters upon the polarized beam splitter 24a, 24b, 24c. At this time, because the light beam is twice transmitted through the second λ/4 plate 26a, 26b, 26c, the vibration direction of the vibration vector is rotated through an angle of 90 degrees again. Accordingly, the light beam is reflected by the reflection surface within the polarized beam splitter 24a, 24b, 24c.

The light beam that has been reflected by the reflection surface of the polarized beam splitter 24a, 24b, 24c is guided to the CCD 12a, 12b, 12c, and is imaged on the light-receiving surface as a prescribed image. And, position correction processing is performed of the images according to the prescribed image data that is gotten by their corresponding respective CCDs 12a, 12b, and 12c. These pieces of position correction processing are performed substantially in the same way as in the case of the above-described fifth embodiment.

As explained above, according to the eleventh embodiment, even in case having used the DMD as the image display device, substantially the same effect as attainable with the fifth embodiment can be easily obtained.

Next, the exposure apparatus according to a twelfth embodiment of the present invention will hereafter be explained.

Figure 27:
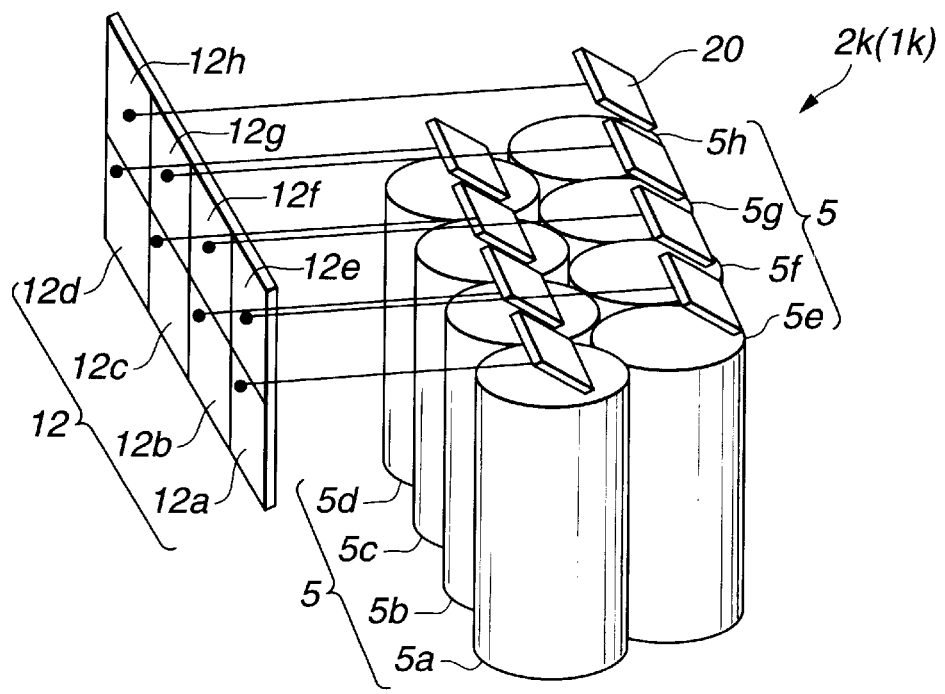
FIG. 27 is a main-part perspective view illustrating a main part of the exposure apparatus according to a twelfth embodiment of the invention.
Figure 28:
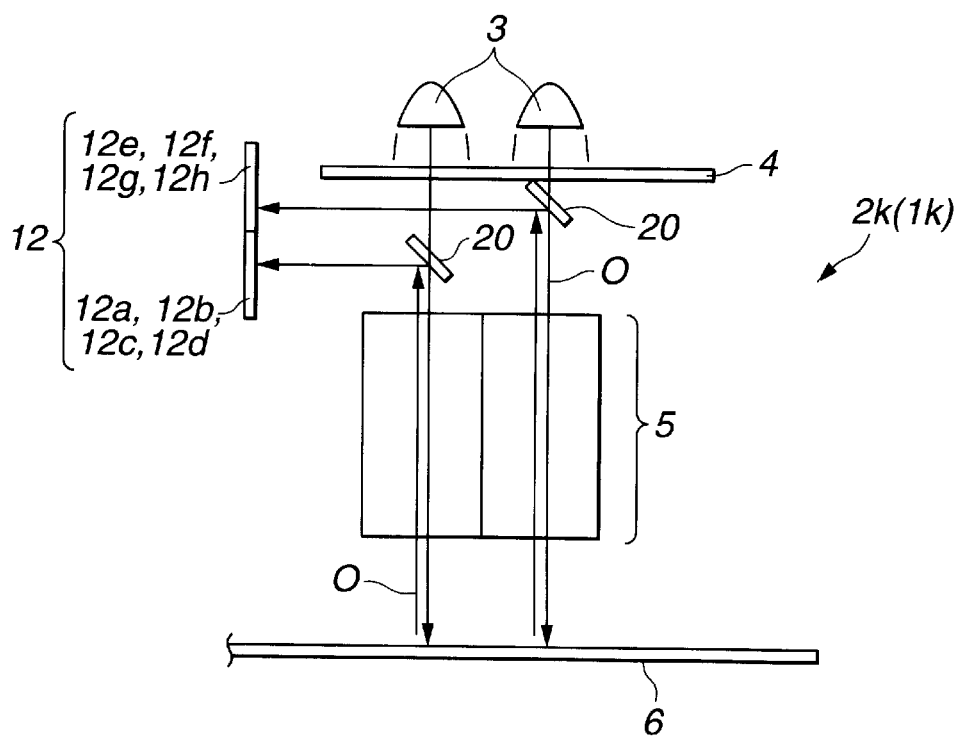
FIG. 28 is a construction view that is taken when having looked at the exposure apparatus of FIG. 27 from a side thereof.

FIGS. 27 and 28 illustrate a main part of the exposure apparatus of this embodiment. FIG. 27 is a perspective view illustrating a main part of the exposure apparatus while FIG. 28 is a construction view that is taken when the exposure apparatus is viewed from its side surface. The construction of this embodiment is basically substantially the same as that of the above-described fifth embodiment (see FIG. 14 and FIGS. 15A and 15B). However, whereas in the exposure apparatus 1D of the above-described fifth embodiment the respective CCDs 12a, 12b, and 12c constituting the imaging element 12 are disposed in the vicinities of their respective corresponding light beam splitter means (the prisms 11a, 11b, and 11c of the beam splitter 11, in the exposure apparatus 1K of this embodiment a plurality of the CCDs 12a, 12b, 12c, 12d, 12e, 12f, 12g, and 12h constituting the imaging element 12 are collectively disposed at the same prescribed position within the exposure apparatus 1K. Correspondingly to this, an electric circuit for controlling the respective CCDS 12a, 12b, 12c, 12d, 12e, 12f, 12g, and 12h, wiring therefor, etc. (not illustrated) also are disposed at their prescribed positions.

As the light beam splitter means in the exposure apparatus 1K of this embodiment, in place of the beam splitter 11 comprised of the prisms used in the above-described fifth embodiment, a plurality of semi-transmission mirrors (half mirrors) 20 are provided so as to correspond to the respective CCDs 12a, 12b, and 12c. The remaining construction is the same as that of the above-described fifth embodiment.

In FIG. 27, forbrevity of the illustration, the illumination device and the image display device are not illustrated. However, actually, in FIG. 28, the image display device 4 is disposed in the space between the illumination device 3 and half mirrors 20 provided at the upper prescribed positions.

In the exposure apparatus 1K of the twelfth embodiment that has been constructed in the above-described way, also, the same effect as attainable with the fifth above-described embodiment can be obtained. In addition, various kinds of members constituting the exposure apparatus 1K can be efficiently disposed. So this can contribute to miniaturizing the exposure apparatus 1K per se including the exposure means 2K.

Figure 29:
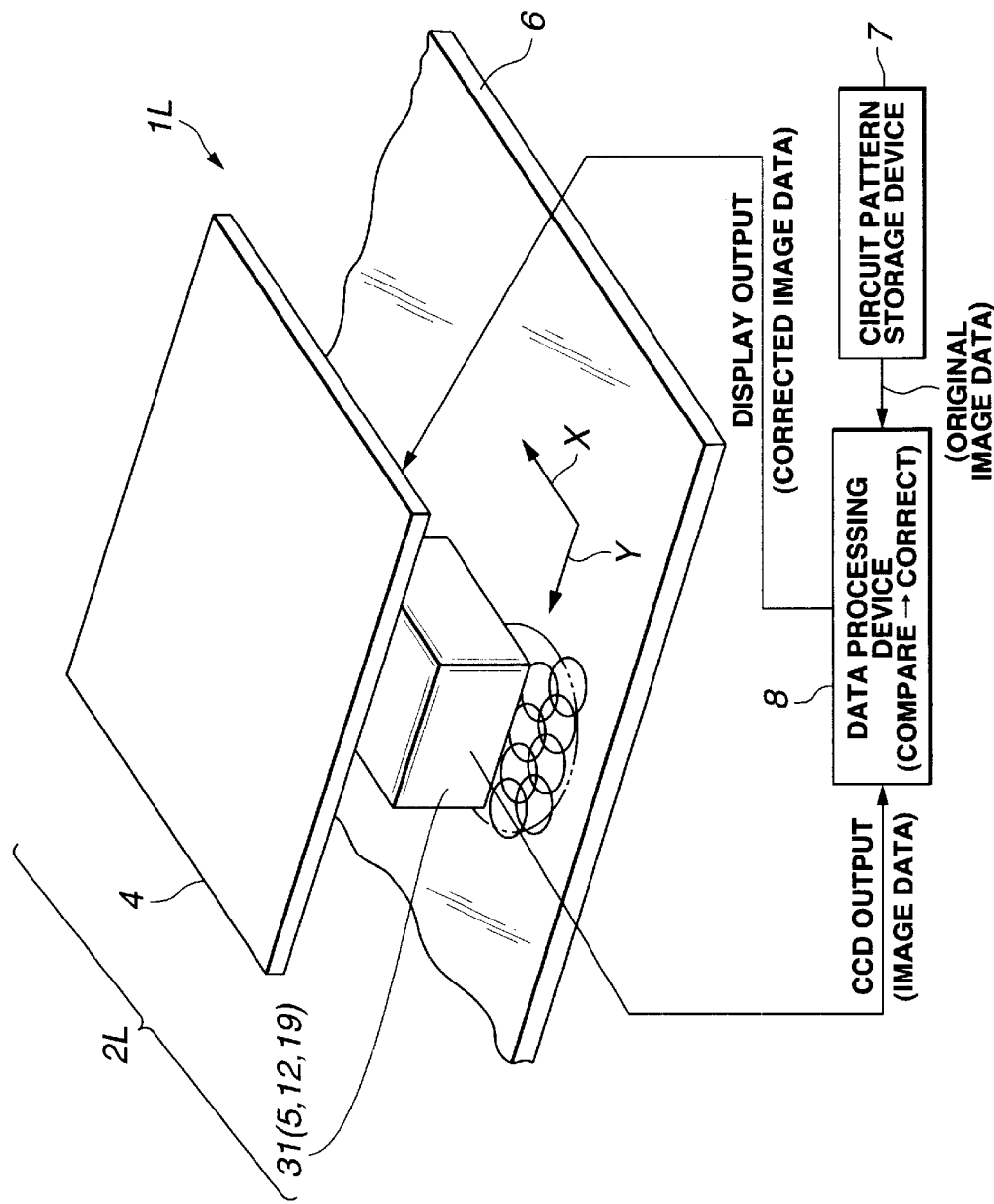
FIG. 29 is a main-part construction view illustrating a main part of the exposure apparatus according to a thirteenth embodiment of the invention.

FIG. 29 is a main-part construction view illustrating a main part of the exposure apparatus according to a thirteenth embodiment of the present invention.

The basic construction of the exposure apparatus 1L of this embodiment is substantially the same as that of the above-described fifth embodiment (see FIG. 14). However, in the exposure apparatus 1L of this embodiment, as in the case of the above-described third embodiment (see FIG. 12), the projection unit 31 including the magnifying projection optical system 5 and image measurement means is two-dimensionally moved within a flat plane that opposes the substrate 6 that becomes an object to be worked by the use of prescribed moving means. It is thereby arranged to project a desired circuit pattern image onto the exposure surface of the substrate 6.

For that reason, in the exposure apparatus 2L of this embodiment, it is set that the range over that the exposure operation, which is performed once, can expose the substrate 6 becomes part of the whole region with respect to that exposure is to be performed. And, while moving the projection unit 31 within the prescribed two-dimensional flat plane in the arrow X and arrow Y directions of FIG. 29, the exposure operation is performed a plurality of times. It is thereby arranged to perform exposure of a single unit of circuit pattern image with respect to the whole of a prescribed region of the substrate 6.

The projection unit 31 is constructed of a plurality of the magnifying projection optical systems 5, a plurality of the imaging elements 12, a plurality of the half mirrors 20 or a plurality of the beam splitters 11. Because the basic construction of the projection unit 31 is substantially the same as in the case of the above-described fifth embodiment or twelfth embodiment or other, a detailed explanation thereof and an illustration of the concrete construction are omitted.

On the other hand, the image display device 4 constituting the exposure means 2L, the illumination device (not illustrated) provided at a prescribed position that is located upper than the device 4, and the substrate 6 that is an object to be worked with respect to that exposure is performed, are each in a state of being made fixed. And, the projection unit 31 is located in the space between the image display device 4 and the substrate 6. The projection unit 31 is constructed so as to be two-dimensionally moved within a prescribed flat plane that opposes the substrate 6 by a moving mechanism (not illustrated) that is prescribed moving means that is formed using a motor, etc.

Also, the image display device 4 has provided therein a plurality of the liquid crystal display panels 4a, 4b, 4c, - - - , 4n so as for them to cover the whole of a prescribed range of the substrate 6 with respect to that exposure is to be performed. It is thereby arranged that the single unit of circuit pattern image that is to be exposed be displayed thereon at all times.

The other structures and operations, for example, the electrical structures and operations of the circuit pattern storage device 7, the data processing device 8 and the like, are similar to those in the fifth embodiment.

As has been explained above, according to the above-described thirteenth embodiment, even in case having constructed the exposure apparatus in such a form as is equipped with the image measurement means, it is possible to realize the same construction as in the case of the above-described third embodiment. Therefore, by performing position correction processing of the image by equipping the exposure apparatus with the image measurement means as in the fifth embodiment, a more reliable circuit pattern image can be projected. It is also possible to simplify the construction of the projection unit 31 including the magnifying projection optical system 5 and the image measurement means as in the above-described third embodiment. Accordingly, it is possible to easily realize the reduction in the number of the manufacturing steps and also that in the manufacturing cost, which resultantly contributes to reducing the manufacturing cost of the exposure apparatus 1B.

Next, the exposure apparatus according to a fourteenth embodiment of the present invention will hereafter be explained.

Figure 30:
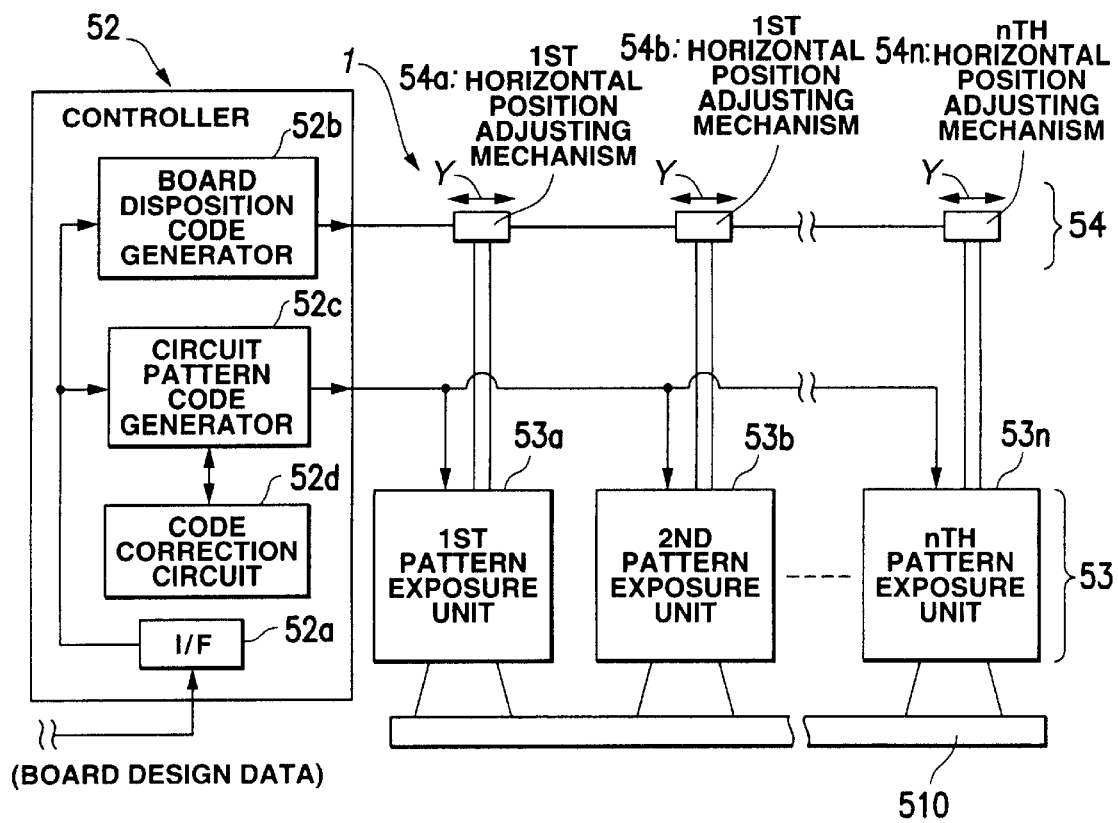
FIG. 30 is a schematic construction view schematically illustrating the construction of the exposure apparatus according to a fourteenth embodiment of the invention.
Figure 31:
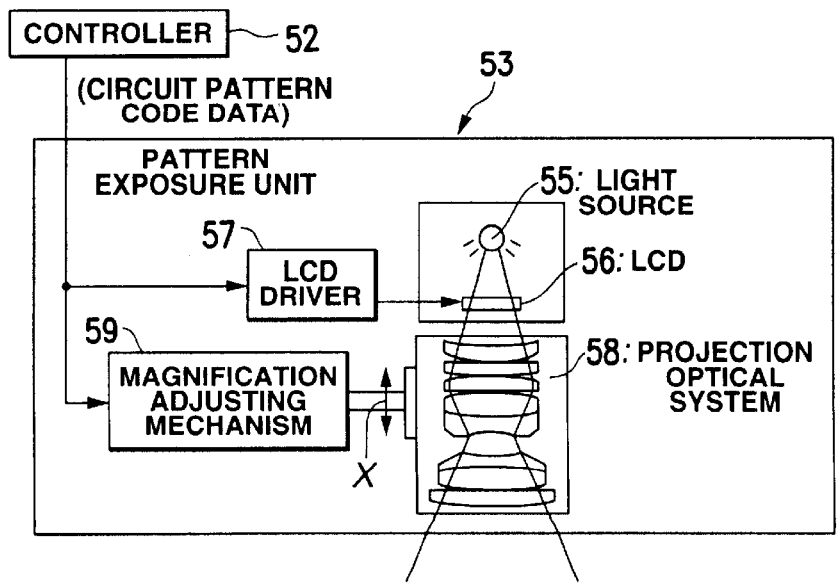
FIG. 31 is a schematic construction view schematically illustrating the construction of a pattern exposure unit in the exposure apparatus of FIG. 30.

FIG. 30 is a schematic construction view schematically illustrating the construction of the exposure apparatus according to the fourteenth embodiment of the invention. FIG. 31 is a schematic construction view schematically illustrating the construction of a pattern exposure unit in the exposure apparatus of this embodiment.

The exposure apparatus of this embodiment is for manufacturing a high-density printed substrate such as a BGA substrate or CSP substrate, which has printed thereon a desired circuit pattern, without using an exposure printing mask. This exposure apparatus has a construction wherein the circuit pattern standing on the use of prescribed data representing a desired circuit pattern is displayed by the display means such as liquid crystal display panels. This display is projected onto the exposure surface of a prescribed substrate material member. Thereby, exposure is performed with respect thereto.

Namely, as illustrated in FIG. 30, the exposure apparatus 1 of this embodiment is constructed so as to receive circuit pattern data, such as substrate design data, prepared by the circuit pattern being converted to a prescribed format of data and to perform prescribed signal processing thereon. And, the exposure apparatus 1 comprises a controller 52 that is control means for performing general control over the whole exposure apparatus 1, a plurality of pattern exposure units 53 that performs exposure of the whole of a desired circuit pattern onto a prescribed position of the exposure surface of the prescribed substrate material member 510 becoming the object to be manufactured every prescribed-region circuit pattern, and a plurality of horizontal position-adjusting mechanisms 54 for adjusting the positions in the horizontal direction of a plurality of the pattern exposure units 53, i.e., the positions thereof within a plane parallel with the exposure surface of the substrate material member 510 to be exposed.

The controller 52 comprises an interface part (the part indicated simply as "I/F" in FIG. 30) 52a that is connection means for receiving data transmitted from an external device (not illustrated) having recorded therein in a prescribed format the desired substrate design data, etc., a substrate disposition code generator 52b that generates code signals for disposing respective ones of a plurality of the pattern exposure units 53 upon receipt of prescribed data signals from that interface part 52a so that those respective pattern exposure units may be situated at their prescribed positions relative to the exposure surface, a circuit pattern code generator 52c that generates code signals representing the circuit pattern regions corresponding to the individual pattern exposure units 53 upon receipt of the data signals from the interface part 52a, and a pattern code correction circuit 52d that performs prescribed pieces of correction processing with respect to the code signals representing the circuit pattern regions generated from the circuit pattern code generator 52c, e.g. signal correction processing for correcting the distortions that optically occur in those code signals, etc.

The pattern exposure unit 53 is constructed of a plurality of pattern exposure units each having the same construction such as, for example, a first pattern exposure unit 53a, second pattern exposure unit 53b, - - - , nth pattern exposure unit 53n. For brevity of the illustration, the individual pattern exposure units 53a, 53b, 53n are disposed in FIG. 30 in one row in the lateral direction, they may be arranged, for example, in a column/row fashion (in the form of a matrix).

With respect to a plurality of the pattern exposure units 53, correspondingly thereto, the same number of horizontal position-adjusting mechanisms 54. Namely, the horizontal position-adjusting mechanism 54 is constructed so that a plurality of horizontal position-adjusting mechanisms each having the same construction, such as a first horizontal position-adjusting mechanism 54a, second horizontal position-adjusting mechanism 54b, - - - , nth horizontal position-adjusting mechanism 54n, may correspond to the respective ones of the above-described pattern exposure units.

These horizontal position-adjusting mechanisms 54 are ones for adjusting the positions of the individual pattern exposure units 53 correspondingly to the kinds of the printed substrate to be manufactured. The position adjustment therefor is performed according to the input substrate design data.

A detailed construction of the pattern exposure unit 53 in the exposure apparatus 1 of this embodiment will hereafter be explained.

The pattern exposure unit 53 of this exposure apparatus 1, as illustrated in FIG. 31, comprises the liquid crystal display device (hereinafter referred to simply as "LCD") that is display means for displaying as the image the circuit pattern that is represented by the circuit pattern code data (signal) transmitted on from the controller 52, and that is comprised of a liquid crystal display panel, etc., an LCD driver 57 that performs drive control of the LCD 56, a light source 55 that illuminates the display made by the LCD 56, a projection optical system 58 that is comprised of a plurality of optical lenses, etc. and that projects onto the exposure surface of the substrate material member 510 by being magnified or size reduced the circuit pattern image that is formed through the illumination of the illumination light beam from the light source 55 over the circuit pattern displayed in the LCD 56, and a magnification adjustment mechanism 59 for adjusting the magnification by moving that projection optical system 58 in the direction that is along the optical axis thereof.

In this embodiment, the LCD 56 is used as the means for displaying as the image the circuit pattern represented by the substrate design data, i.e. the means for modulating the spatial intensity distribution of the illumination light from the light source 55 according to the circuit pattern (circuit pattern code data) represented by the substrate design data. However, the embodiment is not limited to this way of use of the LCD 56. For example, as another example, a DMD (digital micro-mirror device) or the like may be used. This DMD is one that has a function of modulating the spatial intensity distribution of the illumination light by controlling the direction of the reflected light beam.

As the high-density printed substrate that is to be manufactured by the exposure apparatus 1 of this embodiment, there are, for example, a BGA substrate, CSP substrate, etc. Hereafter, a brief explanation will be given of the BGA substrate and CSP substrate.

Figure 32:
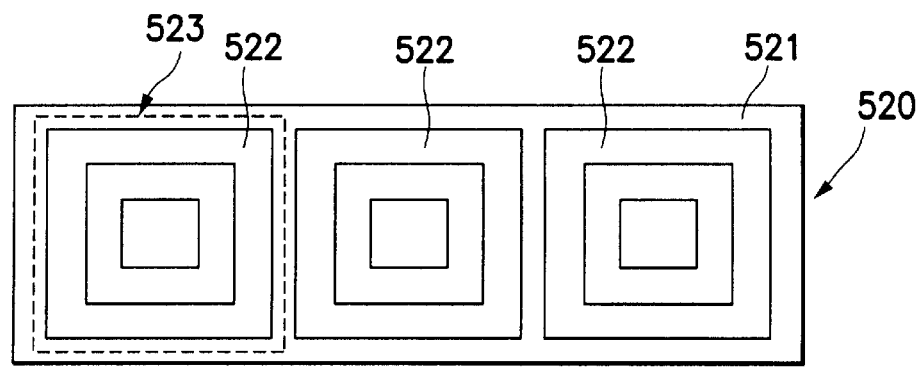
FIG. 32 is a conceptual view illustrating a general BGA substrate and simultaneously is a view illustrating the exposure region of one piece of the pattern exposure unit of the exposure apparatus of FIG. 30.
Figure 33:
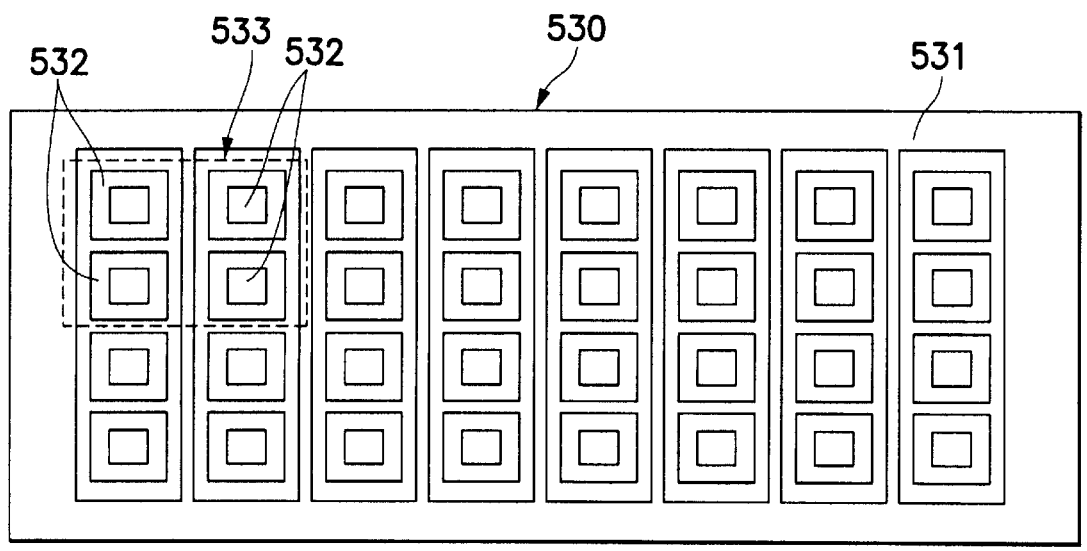
FIG. 33 is a conceptual view illustrating a general CSP substrate and simultaneously is a view illustrating the exposure region of one piece of the pattern exposure unit of the exposure apparatus of FIG. 30.

FIG. 32 is a conceptual view illustrating the BGA substrate, and FIG. 33 is a conceptual view illustrating the CSP substrate. In each of FIGS. 32 and 33, illustration is simultaneously made of the range of the exposure region with respect to that exposure can be performed with a single piece of the pattern exposure unit of the exposure apparatus.

Generally, the BGA substrate, CSP substrate, etc. each are formed as illustrated in FIGS. 32 and 33. Namely, one substrate frame (also simply called "a frame") 521, 531 is formed of a plurality of circuit patterns (also called "pieces") 522, 532. Specifically, for example, in the example of the BGA substrate 520 illustrated in FIG. 32, three pieces 522 constitute one frame 521. Also, in the example of the CSP substrate 530 illustrated in FIG. 33, four pieces 532 in the vertical direction and eight pieces 532 in the horizontal direction are disposed in the fashion of columns and rows. Namely, 4 (pieces)×8 (pieces)=32 pieces constitute one frame 531.

In this way, the high-density substrate such as the BGA substrate 520 or CSP substrate 530, ordinarily, is formed in such a way that a plurality of the same circuit patterns (pieces) 522, 532 are arrayed within one substrate frame 521, 531.

When manufacturing this BGA substrate 520, CSP substrate 530, etc., in the exposure apparatus 1 of this embodiment, the exposure region with respect to that exposure can be performed by the pattern exposure unit 53 at one time is set so as to fall upon the region (the symbols 523, 533) surrounded by a dotted line in FIGS. 32, 33.

In the ordinary BGA substrate 520, it is usual that the individual pieces 522 that form this substrate 520 each is formed of a relatively large-sized pattern. As a result of this, in the exposure apparatus 1, as illustrated in FIG. 32, it is set that with respect to the BGA substrate one piece 522 can be exposed by one pattern exposure unit 53 at one time. Accordingly, in the example of the BGA substrate 520 illustrated in FIG. 32, using the three pattern exposure units 53, the circuit pattern of the whole BGA substrate 520 can be exposed through the performance of one exposure operation.

On the other hand, in the ordinary CSP substrate 530, it is usual that the pattern size of the individual pieces 532 forming the substrate 530 is set to a relatively small pattern size. For example, assume here that the size of one piece of the BGA substrate 520 illustrated in FIG. 32 correspond to the size of four pieces of the CSP substrate 530 illustrated in FIG. 33. Then, as illustrated in FIG. 33, in the case of the CSP substrate 530, it can be set that, with respect to the mutually adjacent four pieces 532, exposure can be performed by one pattern exposure unit 53 at one time. Accordingly, in the example of the CSP substrate 530 illustrated in FIG. 33, using the eight pattern exposure units 53, the circuit pattern of the whole CSP substrate 530 can be exposed through the performance of one exposure operation.

In this way, in the exposure apparatus 1 of this embodiment, the amount of the exposure regions that is exposed by one pattern exposure unit 53 at one time is set in units of a piece. Namely, it is set that, within the exposure region that is exposed by one pattern exposure unit 53, one, or a plurality of, pieces 522, 532 are included in units of a piece. And, it is set that, with one piece 522, 532 being divided into smaller sized pieces, the respective regions of the thus-divided pieces are prevented from being set so as to be exposed by their respective different pattern exposure units 3.

The operation of the exposure apparatus 1 of this embodiment having this construction will hereafter be explained.

First, from a prescribed external device (not illustrated) that is electrically connected to the controller 52 there is input thereto substrate design data. Then, this substrate design data is input to the substrate disposition code generator 52b and to the circuit pattern code generator 52c via the interface part 52a.

In the substrate disposition code generator 52b, according to the substrate design data signals input thereto there are generated prescribed code signals for setting the first to nth pattern exposure units 53a to 53n so as for respective ones of these units 53a to 53n to be disposed at their corresponding prescribed positions that oppose the exposure surface of the substrate material member 510. The code signals that have been generated from there are transmitted to the first to nth horizontal position-adjusting mechanisms 54a to 54n, thereby performing drive control of their corresponding first to nth pattern exposure units 53a to 53n in the horizontal direction, i.e., in the arrow Y direction of FIG. 30 to thereby adjust these exposure units to their respective prescribed positions.

On the other hand, in the circuit pattern code generator 52c, according to the substrate design data signal input thereto, there are generated code signals of the prescribed circuit patterns. And, the code signals of the circuit patterns that have been generated from there are output to the first to nth pattern exposure units 53a to 53n, respectively.

Also, to the circuit pattern code generator 52c there is input data (hereinafter referred to as "correction data") regarding the correction processing that is sent from the pattern code correction circuit 52d. This correction data is one that is used in the following case.

The exposure apparatus 1 is constructed so that the circuit pattern image that is projected by the projection optical system 58 may be exposed to the surface of exposure of the prescribed substrate material member 510 as stated previously. Accordingly, when performing the exposure operation, a case where depending upon the projection conditions under that the projection optical system 58 performs its projection optical distortions, etc. occur in the circuit pattern image imaged on the exposure surface of the substrate material member 510 is also considered to arise. In such a case, if performing prescribed correction processing with respect to the substrate design data in advance, it becomes possible to expose the circuit pattern image that at all times accords with the substrate design data regardless of the projection conditions at the time of the exposure.

Accordingly, to this end, in the exposure apparatus 1, there is provided therein the code correction circuit 52d comprised of an EEPROM having stored therein beforehand prescribed correction data, etc. And, from this code correction circuit 52d, correction data is read out according to the necessity. It is thereby arranged to perform signal correction processing, etc. of the code signal representing the circuit pattern that is to be generated from the circuit pattern code generator 52c. The signals (data) that represent the circuit pattern code and that have been thus generated from the circuit 52c are respectively output to the first to nth pattern exposure units 53a to 53n.

In the first to nth pattern exposure units 53a to 53n, the data of the circuit pattern code that is input thereto is transmitted to the LCD driver 57 and to the magnification adjustment mechanism 59 (see FIG. 31).

The LCD driver 57 performs prescribed signal processing with respect to the circuit pattern code data that is input thereto and generates a signal having a format of its being able to be displayed as the image. And, the signal that has been generated therefrom is transmitted to the LCD 56. Upon receipt of the resulting signal, in the display part (not illustrated) of the LCD 6, a desired circuit pattern is displayed. It is to be noted that the circuit pattern that is displayed in the display part of the LCD 6 in each of the respective pattern exposure units 53a to 53n represents a partial region of the whole circuit pattern that is represented by the substrate design data. Namely, that circuit pattern is one that corresponds to the prescribed region indicated in each of FIGS. 32 and 33.

And, the display part of each LCD 56 is illuminated by the illumination light emitted from the light source 55 corresponding thereto. As a result of this, the circuit pattern that is being displayed in the display part of the LCD 56 is projected to a prescribed position of the exposure surface of the substrate material member 510 via the projection optical system 58. Thereby, the circuit pattern image is imaged thereon.

On the other hand, in the magnification-adjusting mechanism 59, according to the circuit pattern code data that has been input thereto, control is performed so that the circuit pattern image that is to be imaged on the exposure surface of the substrate material member 510 may be imaged in a prescribed form. This control is performed by performing drive control of the projection optical system 58 in the arrow X direction of FIG. 31 according to a prescribed instruction signal contained in the circuit pattern code data from the controller 52.

In the above-described way, onto the exposure surface of the substrate material member 510 there is faithfully projected the circuit pattern image that is wanted to be represented by the substrate design data. Thereby, that circuit pattern image is accurately projected with respect to a prescribed position of the substrate material member 510.

As has been explained above, according to the fourteenth embodiment, correspondingly to a plurality of the pattern exposure units 53, the same number of horizontal position adjustment mechanisms 54 are disposed. It is thereby arranged that these horizontal position adjustment mechanisms 54 adjust the positions of the individual pattern exposure units 53 according to the substrate design data that is input thereto. Accordingly, it is possible to easily cope with various kinds of circuit patterns, etc. and in hence to realize the exposure apparatus that has a simple construction and that has a high level of applicability.

Also, in this fourteenth embodiment, there is made up a construction wherein without using the exposure printing mask a desired circuit pattern is displayed in the liquid crystal display device (LCD) 56. And, that displayed circuit pattern is formed on the exposure surface of the substrate material member 510 using the projection optical system 58. As a result of this, the steps that were conventionally needed to be executed, e.g. the step of producing the exposure printing mask, etc. can be omitted.

Also, this exposure apparatus has equipped therein a plurality of the pattern exposure units 53, each of which is arranged to expose only a prescribed region alone of the whole circuit pattern that is to be exposed onto the whole of the substrate material member 510. In addition, the exposure operation that is performed by each of a plurality of the pattern exposure units 53 is simultaneously performed in parallel. Therefore, the pieces of high-speed processing can be realized with a simple construction. This also can easily contribute to reducing the manufacturing cost.

By the way, the individual circuit pattern images that are formed on the exposure surface of the substrate material member 510 by a plurality of the pattern exposure units 53 are arranged so that those pattern images as a whole represent one unit of circuit pattern. In the exposure apparatus 1 of this embodiment, the whole circuit pattern is so arranged as to be formed by a plurality of the pattern exposure units 53. Therefore, when the number of the individual circuit patterns increases, it is considered as being possible that displacements inconveniently occur in the relative positional relationship between fellow ones of the circuit pattern images formed by the individual pattern exposure units 53. In case positional displacements have occurred between fellow ones of the individual circuit pattern images, the substrate design data that correspond to the whole circuit pattern cannot faithfully be reproduced with respect thereto. Therefore, the substrate design data becomes inaccurately reproduced.

In this view, in a fifteenth embodiment that will be explained next, there is provided means for reliably imaging the respective circuit pattern images formed by the individual pattern exposure units onto prescribed positions of the exposure surface of the substrate material member 510.

Figure 34:
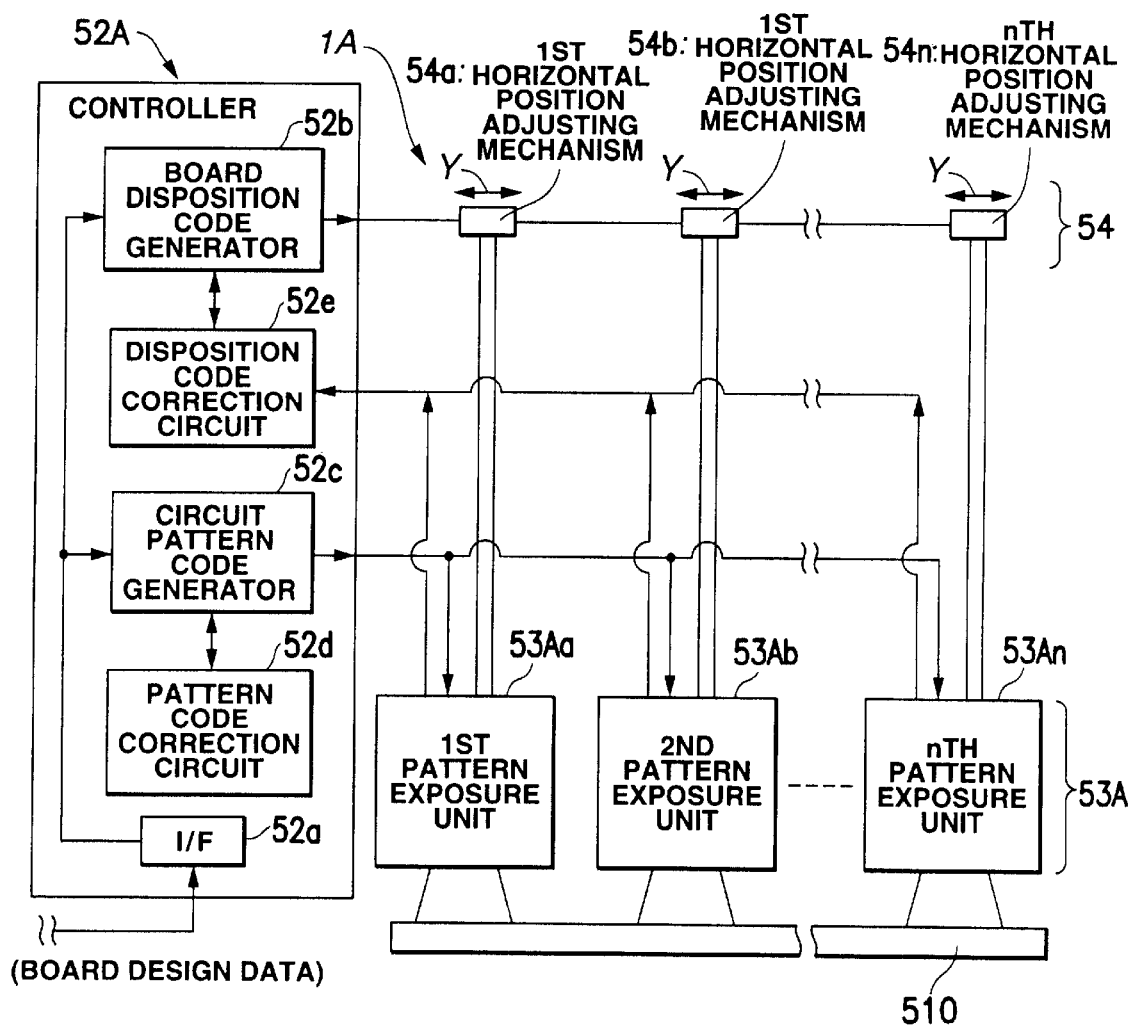
FIG. 34 is a schematic construction view schematically illustrating the construction of the exposure apparatus according to a fifteenth embodiment of the invention.
Figure 35:
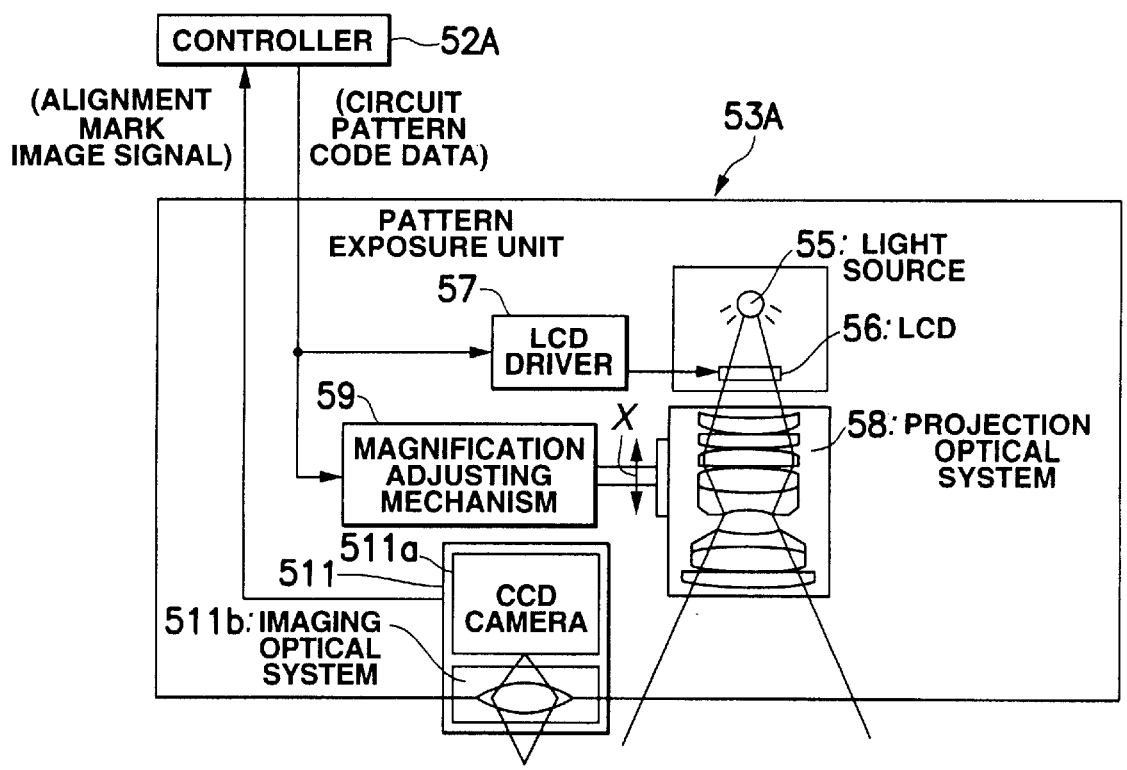
FIG. 35 is a schematic construction view schematically illustrating the construction of the pattern exposure unit in the exposure apparatus of FIG. 34.

FIG. 34 is a schematic construction view schematically illustrating the construction of the exposure apparatus according to the fifteenth embodiment of the present invention. FIG. 35 is a schematic construction view schematically illustrating the construction of the pattern exposure unit in the exposure apparatus of this embodiment.

As illustrated in FIG. 34, the basic construction of the exposure apparatus 1A of this embodiment is substantially the same as that of the exposure apparatus 1 of the above-described fourteenth embodiment. In this embodiment, as stated above, there is only the difference from the latter embodiment that there is further provided the means for reliably imaging the respective circuit pattern images formed by the individual pattern exposure unit 53 onto prescribed positions of the exposure surface of the substrate material member 510. Accordingly, regarding the same construction as in the case of the fourteenth embodiment, the same symbols are used to represent the constituent members thereof and a detailed explanation thereof is omitted with only the different portions alone being explained below.

In this exposure apparatus 1A, as illustrated in FIG. 35, there is newly disposed additionally to the fourteenth embodiment the imaging means 511 that is provided within the pattern exposure unit 53a and that gets image data for producing correction data for correcting the positional displacement thereof with respect to the substrate material member 510. Also, there is newly disposed additionally to the above-described fourteenth embodiment, as illustrated in FIG. 34, constituent members such as, for example, a disposition code correction circuit 52e that is provided within the controller 52A (control means) for performing general control over the exposure apparatus 1 and that produces disposition codes for correcting and setting the disposition with respect to the substrate material member 510 of the pattern exposure unit 53 according to the image data having been gotten by the imaging means 511.

The imaging means 511 is comprised of a CCD camera 511a that has an imaging element such as a CCD, an imaging optical system 511b that condenses the light beam from the exposure surface of the substrate material member 510 and forms a prescribed image so as to image this prescribed image onto a prescribed position within the CCD camera 511a, etc.

The image data (image signal) that is obtained through the imaging operation of the imaging means 511 is data representing the alignment marks that are provided at prescribed positions of the prescribed exposure regions (see FIGS. 32 and 33) of the substrate material member 510 corresponding to the respective pattern exposure units 53, for example, the images including prescribed openings, etc. that are formed in the substrate material member 510 beforehand. It is to be noted that, in the following explanation, this image data (image signal) is referred to as "the alignment mark image signal".

The imaging means 511 that is provided within each of the respective pattern exposure units 53 is electrically connected to the disposition code correction circuit 52e that is provided within the controller 52A. It is thereby arranged that the alignment mark image signal that is gotten by the imaging means 511 be transmitted to the disposition code correction circuit 52e.

The disposition code correction circuit 52e is electrically connected to a substrate disposition code generator 52b within the controller 52A. It is also so arranged as to be able to receive the alignment mark image signal from the imaging means 511 of the respective pattern exposure unit 53 as stated above.

As illustrated in FIG. 34, a pattern code correction circuit 52d that is provided within the controller 52A corresponds to the code correction circuit 52d in the above-described fourteenth embodiment. The remaining construction is the same as in the case of the fourteenth embodiment.

The operation of this embodiment that has been constructed in such way is substantially the same as in the case of the fourteenth embodiment but differs therefrom in the following respects.

In the exposure apparatus 1A of this embodiment, first, in advance of the actual performance of the exposure operation, the positions of the respective pattern exposure units 53 are adjusted so as to become prescribed positions taken with respect to the substrate material member 510. For this reason, the controller 52A controls the respective imaging means 511 of the pattern exposure units 53 to thereby cause them to perform their prescribed imaging operations. The imaging means 511 thereby gets the corresponding alignment mark image signals.

The respective alignment mark image signal that has been gotten by the imaging means 511 is transmitted to the disposition code correction circuit 52e of the controller 52A. Upon receipt of it, the disposition code correction circuit 52e performs prescribed signal processing on it according to the thus-gotten alignment mark image signal. The disposition code correction circuit 52e thereafter outputs the resulting signal to the substrate disposition code generator 52b.

On the other hand, the substrate design data that is input from a prescribed external device (not illustrated) to the controller 52 is input to the substrate disposition code generator 52b and to the circuit pattern code generator 52c via the interface part 52a.

The substrate disposition code generator 52b produces, according to both of the input substrate design data signal and the above-described disposition code correction circuit 52c, a prescribed code signal for setting so that the respective pattern exposure units 53 may be disposed at prescribed positions that oppose the exposure surface of the substrate material member 510. The code signal that has been generated from there is transmitted to each of the respective horizontal position-adjusting mechanisms 54. Thereby, the corresponding pattern exposure units 53 are drive controlled in the horizontal direction, i.e. the arrow Y direction of FIG. 34 and are thereby adjusted so as to be located at their respective positions.

On the other hand, in the circuit pattern code generator 52c, according to the substrate design data that has been input thereto, completely the same operation as in the circuit pattern code generator 52c in the fourteenth embodiment is performed. Then, the prescribed circuit pattern signal that has been produced there is output to the respective pattern exposure units 53. In the respective pattern exposure units 53, upon receipt of that circuit pattern signal, completely the same operation as in the fourteenth embodiment is performed, with the result that a desired circuit pattern image is projected onto the exposure surface of the substrate material member 510.

In this way, onto the exposure surface of the substrate material member 510 there is faithfully projected the circuit pattern that is represented by the substrate design data. And, this circuit pattern image is accurately exposed with respect to a prescribed position of the substrate material member 510.

As has been explained above, according to the fifteenth embodiment, the same effect as attainable with the above-described fourteenth embodiment can be obtained. Along with this, in this embodiment, according to the alignment mark image signal that has been gotten by the imaging means 511 in advance, the disposition code correction circuit 52e performs prescribed pieces of correction processing to thereby produce prescribed disposition codes. And, it is thereby arranged that the respective pattern exposure units 53 are reliably disposed at their prescribed positions according to those prescribed dispositions codes. Accordingly, the exposure operation can be performed with a high level of precision. Resultantly, a higher quality of high-density printed substrate can be easily manufactured.

It is obvious that in the present invention different modes of embodiment can over a wide range be constructed according to the invention without departing from the spirit and scope of the invention. The present invention is not limited by its specific embodiments excepting that the invention is restricted by the appended claims.

What is claimed is:

1. An exposure apparatus comprising:

means for providing electronic data representing a circuit pattern;

division processing means for dividing the circuit pattern in the form of the electronic data into a plurality of regions so that adjacent ones of the regions may partly overlap each other;

exposure means, comprising: (i) a plurality of image display means for displaying the circuit pattern in correspondence with respective portions of the electronic data corresponding to each divided region of the plurality of regions, and (ii) a plurality of optical systems that project respective ones of the divided regions displayed by the plurality of image display means onto a resist surface of a substrate; and control means for, while causing duplex regions of the adjacent regions to overlap with each other on the resist surface of the substrate, causing the plurality of divided regions to be simultaneously projected onto the resist surface by the exposure means to thereby cause an image of one unit of circuit pattern to be formed on the resist surface of the substrate.

2. An exposure apparatus according to claim 1, wherein said optical systems comprise a plurality of magnifying projection optical systems that project the respective ones of the divided regions displayed by the plurality of image display means onto the resist surface of the substrate on a magnified scale.

3. An exposure apparatus according to claim 2, wherein the image display means includes a liquid crystal display device and a light source for radiating light with respect to the liquid crystal display device.

4. An exposure apparatus according to claim 2, wherein the image display means includes optical control elements that respectively have a plurality of movable minute reflection surfaces disposed in the form of columns and rows, the angle of each of the minute reflection surfaces being individually controllable, and light sources that radiate light onto the optical control elements respectively.

5. An exposure apparatus according to claim 2, wherein said optical systems are adapted to expose, by one exposure operation, the one unit of circuit pattern with respect to a region corresponding to a whole of the substrate.

6. An exposure apparatus according to claim 2, wherein
the control means further includes optical-system moving means for relatively two-dimensionally moving the magnifying projection optical systems or an inverse Fourier transform optical system with respect to the image display means, and correction means for correcting positional displacements of images on the substrate between the divided regions that occur due to relative movements performed by the optical-system moving means, whereby
the control means causes an exposure operation to be performed a plurality of times while performing correction of the positional displacement through the operation of the correction means and movement of an exposure position on the substrate through operation of the optical-system moving means to thereby form the one unit of circuit pattern on the substrate.

7. An exposure apparatus according to claim 2, wherein
the control means further includes exposure-unit moving means for relatively two-dimensionally moving the exposure means with respect to the substrate and correction means for correcting positional displacements of images on the substrate between the divided regions that occur due to relative movements performed by the exposure-unit moving means, whereby
the control means causes an exposure operation to be performed a plurality of times while performing correction of the positional displacement through the operation of the correction means and movement of an exposure position on the substrate through operation of the optical-system moving means to thereby form the one unit of circuit pattern on the substrate.

8. An exposure apparatus according to claim 2, further including
image-measuring means for measuring images on the substrate, and
wherein a result of the measurement performed by the image measuring means is transmitted to the image display means, and is reflected on the display effected by the image display means.

9. An exposure apparatus according to claim 8, wherein
the image-measuring means is disposed in a space between the image display means and the substrate.

10. An exposure apparatus according to claim 9, wherein
the image-measuring means comprises an image-measuring optical system, and the image-measuring optical system concurrently comprises the plurality of magnifying projection optical systems.

11. An exposure apparatus according to claim 8, wherein
the image-measuring means is disposed at a position that opposes the image display means and that is located across the substrate from the image display means.

12. An exposure apparatus according to claim 8, wherein
the image-measuring means is adapted to measure the one unit of circuit pattern image or position-adjusting prescribed images that are projected on the substrate.

13. An exposure apparatus according to claim 8, wherein
the image-measuring means is adapted to measure the one unit of circuit pattern or position-adjusting prescribed marks that have been formed on the substrate in an immediately preceding processing operation.

14. An exposure apparatus according to claim 8, wherein
an integrated amount of illumination light that is radiated when an image-measuring operation is performed through operation of the image-measuring means is set so that the integrated amount may become an amount of illumination light that has no advance effect upon control over exposure of a photo-resist.

15. An exposure apparatus according to claim 8, wherein
illumination light that is radiated when an image-measuring operation is performed through operation of the image-measuring means is set so as to have a wavelength that does not expose a photo-resist.

16. An exposure apparatus according to claim 1, further comprising:
means for two-dimensionally performing Fourier transform processing with respect to each of the respective divided regions, and
wherein said exposure means includes a coherent light source that emits a coherent light beam to said image display means, displays respective Fourier transform processed images corresponding to the respective divided regions that have been Fourier transform processed by the Fourier transform processing means, and modulates an intensity and phase of the coherent light beam incident upon a display surface, and
wherein said optical systems comprise an inverse Fourier transform optical system that performs inverse Fourier transform processing with respect to the coherent light having been modulated by the image display means to thereby form a corresponding divided region image on the resist surface of the substrate.

17. An exposure apparatus according to claim 16, wherein
the image display means comprises a liquid crystal display device.

18. An exposure apparatus according to claim 16, wherein
the image display means includes optical control elements that respectively have a plurality of movable minute reflection surfaces arrayed in the form of columns and rows, an angle of each of the minute reflection surfaces and a displacement in a direction perpendicular to the surface of the array being individually controllable.

19. An exposure apparatus according to claim 18, wherein
the optical control elements are disposed in such a way that surface having arrayed thereon the minute reflection surfaces perpendicularly intersects optical axes of the projection optical systems of the exposure means.

20. An exposure apparatus according to claim 18, wherein
an incidence direction of illumination light that enters upon the surface of the optical control element having arrayed thereon the minute reflection surfaces defines a prescribed angle with optical axes of the projection optical systems of the exposure means.

21. An exposure apparatus according to claim 16, wherein
said optical systems are adapted to expose the one unit of circuit pattern with respect to a region corresponding to a whole of the substrate.

22. An exposure apparatus according to claim 16, wherein
the control means further includes optical-system moving means for relatively two-dimensionally moving the projection optical systems of the exposure means or the inverse Fourier transform optical system with respect to the substrate and the image display means, and correction means for correcting positional displacements of images on the substrate between the divided regions that occur due to relative movements performed by the optical-system moving means, whereby
the control means causes an exposure operation to be performed a plurality of times while performing correction of the positional displacement through the operation of the correction means and movement of an exposure position on the substrate through operation of the optical-system moving means to thereby form the one unit of circuit pattern on the substrate.

23. An exposure apparatus according to claim 16, wherein the control means further includes exposure-unit moving means for relatively two-dimensionally moving the exposure means with respect to the substrate and correction means for correcting positional displacements of images on the substrate between the divided regions that occur due to relative movements performed by the exposure-unit moving means, whereby the control means causes an exposure operation to be performed a plurality of times while performing correction of the positional displacement through the operation of the correction means and movement of an exposure position on the substrate through operation of the optical-system moving means to thereby form the one unit of circuit pattern on the substrate.

24. An exposure apparatus according to claim 16, further including image-measuring means for measuring images on the substrate, and wherein a result of the measurement performed by the image measuring means is transmitted to the image display means, and is reflected on the display effected by the image display means.

25. An exposure apparatus according to claim 24, wherein the image-measuring means is disposed in a space between the image display means and the substrate.

26. An exposure apparatus according to claim 25, wherein the image-measuring means comprises an image-measuring optical system, and the image-measuring optical system comprises a magnifying projection optical system.

27. An exposure apparatus according to claim 24, wherein the image-measuring means is disposed at a position that opposes the image display means and that is located across the substrate from the image display means.

28. An exposure apparatus according to claim 24, wherein the image-measuring means is adapted to measure the one unit of circuit pattern image or position-adjusting prescribed images that are projected on the substrate.

29. An exposure apparatus according to claim 24, wherein the image-measuring means is adapted to measure the one unit of circuit pattern or position-adjusting prescribed marks that have been formed on the substrate in an immediately preceding processing operation.

30. An exposure apparatus according to claim 24, wherein an integrated amount of illumination light that is radiated when an image-measuring operation is performed through operation of the image-measuring means is set so that the integrated amount may become an amount of illumination light that has no advance effect upon control over exposure of a photo-resist.

31. An exposure apparatus according to claim 24, wherein illumination light that is radiated when an image-measuring operation is performed through operation of the image-measuring means is set so as to have a wavelength that does not expose photo-resist.

32. An exposure apparatus according to claim 1, wherein the means for providing the electronic data comprises receiving means for receiving a signal, and wherein the electronic data is supplied to the division processing means via the receiving means.

33. An exposure apparatus according to claim 1, wherein the means for providing the electronic data comprises storage means for storing the one unit of circuit pattern as electronic data, and wherein the electronic data of the one unit of circuit pattern is read out from the storage means and is supplied to the division processing means.

34. An exposure apparatus comprising a light source that radiates an illumination light for performing exposure;

means for modulating a spatial intensity distribution of the illumination light from the light source according to a code data produced from a design circuit pattern;

a plurality of exposure units each of in which includes an optical system for projecting the illumination light the spatial intensity distribution of which has been modulated;

means for disposing each of individual exposure units according to the code data that is obtained correspondingly to the disposition of the substrate; and means for performing correction processing with respect to the code data representing the design circuit pattern so that a pattern image that is formed according to the code data may be projected onto the surface of exposure in a state of its being proper on this surface of exposure.

35. An exposure apparatus according to claim 34, wherein one sheet of a substrate frame comprises a plurality of circuit patterns each having the same specification, said circuit patterns being arrayed two or more in number; and one piece of an exposure unit of a plurality of the exposure units is arranged to expose one or more of the circuit patterns.

36. An exposure apparatus according to claim 34, wherein the means for disposing each of the individual exposure units according to the code data that is obtained correspondingly to the disposition of the substrate controls the horizontal positions of the respective exposure units.

37. An exposure apparatus according to claim 34, wherein the means for disposing each of the individual exposure units according to the code data that is obtained correspondingly to the disposition of the substrate controls the projection magnifications of the respective exposure units.

38. An exposure apparatus according to claim 34, wherein the means for disposing each of the individual exposure units according to the code data that is obtained correspondingly to the disposition of the substrate comprises means for correcting the positional displacements of fellow ones of the pattern images exposed through the operation of the respective exposure units.

* * * * *